United States Patent [19]

Satoh et al.

[11] Patent Number: 5,523,254
[45] Date of Patent: Jun. 4, 1996

[54] METHOD FOR PRODUCTION OF SOI TRANSISTOR DEVICE AND SOI TRANSISTOR

[75] Inventors: Hiroshi Satoh; Yasunori Ohokubo; Takeshi Matsushita; Toshiyuki Nishihara; Makoto Hashimoto, all of Kanagawa, Japan

[73] Assignee: Sony Corporation, Tokyo, Japan

[21] Appl. No.: 230,734

[22] Filed: Apr. 21, 1994

Related U.S. Application Data

[62] Division of Ser. No. 63,641, May 20, 1993, Pat. No. 5,478,782.

[30] Foreign Application Priority Data

| May 25, 1992 | [JP] | Japan | 4-157436 |
| May 27, 1992 | [JP] | Japan | 4-160268 |
| Jun. 16, 1992 | [JP] | Japan | 4-181790 |
| Jun. 29, 1992 | [JP] | Japan | 4-194861 |

[51] Int. Cl.⁶ .................................. H01L 21/76
[52] U.S. Cl. .................. 437/62; 437/924; 148/DIG. 12
[58] Field of Search .................. 437/62, 924, 984, 437/974, 966; 148/DIG. 12, DIG. 102, DIG. 135; 257/797

[56] References Cited

U.S. PATENT DOCUMENTS

| 4,538,105 | 7/1985 | Ausschnitt | 437/8 |
| 4,851,078 | 7/1989 | Short et al. | 437/62 |
| 4,897,362 | 1/1990 | Delgado et al. | 437/62 |
| 5,017,514 | 5/1991 | Nishimoto | 437/229 |
| 5,022,580 | 6/1991 | Pedder | 437/209 |
| 5,031,681 | 7/1991 | Godbey et al. | 437/62 |
| 5,034,343 | 7/1991 | Rouse et al. | 437/62 |
| 5,102,819 | 4/1992 | Matsushita et al. | 437/62 |
| 5,128,280 | 7/1992 | Matsumoto et al. | 437/924 |
| 5,128,283 | 7/1992 | Tanaka | 437/229 |
| 5,131,968 | 7/1992 | Wells et al. | 437/974 |
| 5,229,305 | 7/1993 | Baker | 437/974 |
| 5,231,045 | 7/1993 | Miura et al. | 437/62 |
| 5,236,118 | 8/1993 | Bower et al. | 437/225 |
| 5,262,347 | 11/1993 | Sands | 437/86 |
| 5,286,673 | 2/1994 | Nishihara | 437/228 |
| 5,294,556 | 3/1994 | Kawamura | 437/21 |
| 5,369,050 | 11/1994 | Kawai | 437/62 |

FOREIGN PATENT DOCUMENTS

| 62-71215 | 4/1987 | Japan | 156/584 |

OTHER PUBLICATIONS

Nikkei Microdevices, Mar. 1988, pp. 82–84.
Abstracts of 21st Conference on Solid State Devices 1989, pp. 89–92.
Maszara et al., Journal on Applied Physics, vol. 64, pp. 4943–4950, Nov. 15, 1988.
J. B. Lasky, Applied Physics Letter 48(1), pp. 78–80, Jan. 6, 1986.
M. Shimbo et al., Journal on Applied Physics, 60(8), pp. 2987–2989, Oct. 15, 1986.

*Primary Examiner*—George Fourson
*Assistant Examiner*—S. Mulpuri
*Attorney, Agent, or Firm*—Ronald P. Kananen

[57] ABSTRACT

A wafer bonding method for forming a SOI structure comprising the steps of bringing wafers into proximity in a state with one wafer a slight, substantially uniform clearance away from the other wafer and pressing one point of at least one wafer of the two wafers against the other wafer. In another aspect of the invention, there is provided a method of positioning for photolithography using an alignment mark portions and/or a vernier portions formed on a SOI substrate, which comprises the step of removing semiconductor layer portions corresponding to the alignment mark portions and/or the vernier portions. In further another aspect of the invention, there is provided a new DRAM semiconductor device formed by using SOI structure, which comprises a new pattern of a strage node formed longitudinally along a word line. Further, there is provided a new DRAM semiconductor device formed by using SOI structure, which comprises a unique strage node having a conductive side wall.

5 Claims, 20 Drawing Sheets

5,523,254

METHOD FOR PRODUCTION OF SOI TRANSISTOR DEVICE AND SOI TRANSISTOR

This application is a division of application Ser. No. 08/063,641 filed May 20, 1993 now U.S. Pat. No. 5,478,782.

BACKGROUND OF THE INVENTION

1. Field of the Invention

The present invention relates to a method for production of a silicon-on-insulator (SOI) transistor device.

More specifically, it relates to a wafer bonding method. The present invention may be used for bonding two substrates to form a clad substrate. For example, it may be utilized for bonding two semiconductor wafers to form a composite semiconductor wafer.

An SOI structure is useful for semiconductor devices and other electronic components. In this technique, a silicon portion is placed on an insulator portion and various semiconductor elements are fabricated in the silicon portion. As one means for formation of an SOI structure, there is known the technique of bonding a separate substrate to a silicon substrate having insulator layer on the surface with the insulator and then polishing the silicon substrate to form silicon portions on the insulator layer. This is generally called a bonding SOI (for the bonding technique, see for example Nikkei McGraw-Hill "Nikkei Microdevices", March 1988, p. 84.)

Further, the present invention relates to a SOI transistor device, in particular a semiconductor device having capacitor storage nodes buried in a thin film semiconductor layer using the SOI structure.

2. Description of the Related Art

The SOI structure is used for various applications. For example, by forming elements in the semiconductor portion on the insulator material, a semiconductor device with good element isolation can be obtained from the beginning.

An example of the SOI structure to which the present invention is applied will be explained below.

Numerous proposals have been made regarding SOI structure semiconductor devices. There are also numerous means for formation of the same. When applying the present invention, any of these may be used. One method of formation is to form a so-called bonding SOI structure. The formation of an SOI structure will be explained referring to FIGS. 1A to 1E taking as an example this technique (see Extended Abstracts on the 21st Conference on Solid State Devices and Materials, Tokyo, 1989, pp. 89–92, M. Hashimoto et. al., "Low Leakage SOI MOSFETs Fabricated Using a Wafer Bonding Method".)

As shown in FIG. 1A, one surface of a silicon substrate 1 (in general, use is made of a silicon wafer with a high degree of flatness, referred to here as the "substrate A") is patterned by photolithography or etching to form depressions of a depth of 1500 angstroms or less. Next, an $SiO_2$ film is formed on this surface by chemical vapor deposition (CVD) etc. so as to form an insulator 2, thereby obtaining a structure of a silicon substrate 1 with an insulator 2 on one side. The insulator 2 is formed as an uneven film as illustrated due to the topography of the patterned silicon substrate 1. Further, a polycrystalline silicon film etc. is formed as a bonding layer 3 on the insulator 2 by CVD etc. to a thickness of about 5 μm. The result is the structure of FIG. 1A. The polycrystalline silicon film forming the bonding layer 3 is used for formation of a highly smooth bonding surface when bonding another substrate (the substrate 4 shown by "B" in FIG. 1C) in a later step.

Next, the surface of the bonding layer 3 is polished to flatten it and obtain a highly smooth surface (FIG. 1B). By this, the bonding layer 3 (polycrystalline silicon film) is reduced to a thickness of 3 μm or less.

Another substrate 4 (referred to here as the "substrate B") is placed in close contact with the polished surface of the bonding layer 3. The two surfaces are bonded by pressing them closely together. As a result the bonded structure shown in FIG. 1C is obtained. In general, it is said that a firm bond is achieved by the hydrogen bonding caused by the action of water or hydroxyl groups interposed between the two surfaces. This assembly is usually then heated for heat bonding to form a strong bonding. The bonding strength is generally at least 200 kg/cm$^2$ and sometimes as high as 2000 kg/cm$^2$. As the other substrate 4 (substrate B) which is bonded use is usually made of the same type of silicon substrate as the substrate 1 (substrate A). This is because a heating step is often applied after the bonding so there is a danger of trouble if the heat expansion and other physical properties are not equal. If this were not a problem, then in the related art shown in FIG. 1, for example, the other substrate 4 would function only as a support, so would not have to absolutely be a silicon substrate. However, if forming elements in the other substrate 4 (substrate B) which is bonded the substrate would have to be a semiconductor substrate allowing the formation of elements.

Next, the substrate 1 is ground to reduce the silicon portion of the substrate 1 to a thickness of about 5 μm or less to form a residual film and obtain the structure shown in FIG. 1D. FIG. 1C to FIG. 1E show the assembly turned upside down from FIG. 1A and FIG. 1B. This is because the assembly is turned upside down to put the substrate i at the top for grinding to obtain the structure shown in FIG. 1D and for the following selective polishing step.

Next, selective polishing is performed. Precision polishing is performed here until the insulator 2 is exposed. As a result, as shown in FIG. 1E, a structure is obtained with silicon portions 10 present on and surrounded by the insulator 2. The silicon portions 10 form the SOI film. In this structure with silicon portions 10 present in an insulator 2 (SOI structure), elements are fabricated in the silicon portions 10. As shown in FIG. 1E, the silicon portions 10 are surrounded by the insulator 2, so the elements are completely isolated from the very start.

FIGS. 1A to 1E showed the silicon portions 10 enlarged for clarifying the illustration. In actuality, there are a large number of fine silicon portions 10.

When forming the bonding SOI structure as described above, sometimes air bubbles are entrained in the bonding interface. Explaining this using FIG. 1C, when bonding the polycrystalline silicon film 3 surface on the substrate 1 with the substrate 4, air bubbles sometimes are entrained at the interface. This is because when bonding flat surfaces of the substrates, there are numerous points of contact and air bubbles easily are entrained. The air bubbles are of a size, for example, of about 0.5 μm to 5 mm.

The bonding surfaces are not in close contact at the portions where the air bubbles are entrained so sufficient bonding is not achieved and peeling easily occurs. For example, after the grinding the surface of FIG. 1D, the thickness t of the film including the substrate 1 on the substrate 4 is 4 to 20 μm, usually about 5 to 10 μm or so, so if there are air bubbles present, peeling easily occurs. This sometimes becomes a source of contamination and can have a serious impact on the fabrication of the elements. For example, the wafers are sometimes scratched by the contamination during the polishing. The peeling due to the air bubbles forms contamination and impairs the reliability of the elements. In the state of FIG. 1E, the thickness $t_2$ of the film on the silicon portion 10 side of the substrate 4 is even thinner, about 3 to 4 μm. If peeling occurs here, it becomes a source of contamination in the same way and sometimes ends up resulting in a defective element.

Therefore, it is necessary to ensure that no air bubbles format the bonding portion of the two substrates.

In the past, to prevent the formation of air bubbles between the two substrates to be bonded when forming a bonding SOI, as shown in FIGS. 2A to 2C, the technique was employed of using a first support 13 for supporting one substrate 12 and a second support jig 14 for supporting another substrate 11, for example, a semiconductor wafer, using the second support jig 14 to make the surface of the supported substrate 11 convex, and bonding with the convexity facing the substrate 12 (the convexity is shown in an exaggerated manner to make the illustration clearer).

In the above type of technique, however, since one substrate 12 is made to be convex for bonding, there is some expansion and contraction of the pattern on the substrate 12, though slight. That is, when the bonding surface of the substrate is convex in shape, in the case of a substrate having a device pattern, the bonding is performed with elongation of the pattern due to the curvature of the convexity. Therefore, there is a possibility of misalignment of the pattern pitch and pattern deviation in the succeeding exposure step. Further, even if the second support jig 14 supporting the substrate 11 is comprised of, for example, a vacuum chuck, it does not necessarily mean that the substrate 11 can be supported with a good convexity. Further, when bonding the substrates to form a flat composite substrate, that is, when bonding the substrates from the state of FIG. 2B to the state of FIG. 2C, a good, tight bond is not achieved and therefore sometimes pattern elongation or contraction will end up occurring. AS a result, with the above described bonding technique, where one of the substrates was made convex, it was difficult to keep up with the demands of the recent technique—where patterns are being increasingly miniaturized.

Next, the other problem related to prior SOI technique will be explained.

The element isolation pattern of an SOI structure obtained by the bonding method is formed, for example, by photolithography of the SOI wafer. There are problems in the photolithographic step, however. That is, in general, positioning marks known as alignment marks are formed at several locations on the chip so as to enable positioning during the photolithography step. Further, separate so-called "vernier" portions are generally formed at one position for each mark on the chip for the purpose of confirmation of the positioning. FIG. 3 and FIG. 4 illustrate the alignment marks in the case of positive photolithography. FIG. 4 shows the sectional shape of an alignment mark portion, while FIG. 3 shows the structure from a plane view. In FIG. 3, the case of positive photolithography is shown. The portion 21 in FIG. 3 is a SOI layer forming the semiconductor portion, while the portion 22 is the SiO$_2$ forming the insulating material (note that in the case of negative photolithography, 21 designates conversely SiO$_2$ and 22 designates the SOI layer). In FIG. 3, "O" indicates the center (origin) of the coordinate system.

FIG. 4 shows the sectional structure of the alignment mark in the case of making a gate window. In FIG. 4, 27 is the semiconductor portion (Si) in this example, while 24 is the insulator (SiO$_2$) surrounding this semiconductor portion. Reference numeral 25 is a polycrystalline silicon layer, while 26 is a top layer of tungsten silicide etc. Here, the semiconductor portion 27 forming the SOI layer has a level difference of as much as 40 nm from the SiO$_2$ portion of the insulating material 24 (see FIG. 4). When using this mark to form a resist pattern on a film with an extremely high reflectance, the exposure apparatus must be able to accurately detect a level difference of as little as 40 nm. This detection is extremely difficult in practice.

FIG. 5 shows the waveform of the alignment signal in the related art. As illustrated there, the signal-to-noise ratio (S/N) ratio is extremely small and the chance of picking up a false signal is high. In FIG. 5, "O" shows the signal peaks.

Use is made of a vernier portion even when measuring the alignment after exposure. Visual detection of the vernier is difficult for the same reasons, however, so accurate measurement of the alignment is not possible.

Next, an explanation will be made of an example of a dynamic random access memory (DRAM) using an SOI structure according to the related art.

Along with the reduction in size of DRAM memory cells and their higher density, use has been made of the SOI structure to secure the required storage capacity. Development has been made of DRAMs and other semiconductor devices with capacitors buried under a semiconductor layer. The key portions of a DRAM or other semiconductor device using such an SOI structure is shown in FIGS. 6A and 6B.

As shown in FIGS. 6A and 6B (wherein FIG. 6A is a sectional view along the line A—A in FIG. 6B), in this semiconductor device, a semiconductor layer 32a constituted by silicon is formed on top of an insulating film layer 42 to produce an SOI structure. On the semiconductor layer 32a are laid word lines 36a and 36b over a gate insulating layer. On top of this are laid an interlayer insulating layer and bit lines 40. The bit lines 40 are connected to the semiconductor layer 32a or the semiconductor layer 32b through bit line contacts 39 made in the interlayer insulating layer. The word lines 36a and 36b serve also as gate electrodes. A channel portion 38 is formed at the semiconductor layer 32a or 32b positioned below the same. As a result, a DRAM memory cell transistor is formed at this portion.

Under the insulating film layer 42 is buried a capacitor storage node 44. The storage node 44 and the semiconductor layer 32a are connected through a contact 43 formed in the insulating film layer 42. Under the storage node 44 is laid a cell plate layer 48 through a capacitor insulating film layer 46. In this semiconductor device, the storage node 44, the insulating film layer 46, and the cell plate 48 constitute the capacitor.

In a semiconductor device of such a structure, the area occupied by the capacitor is made large to increase the capacity of the capacitor. Also, the level difference of the capacitor does not have a detrimental effect on the wiring patterning.

However, in a semiconductor device of an SOI structure now under development, as shown in FIGS. 6A and 6B, the layout pattern of the storage node 44 is positioned at the layers below the channel portion 38 of the semiconductor layer 32a or 32b, so there were the following problems:

The potential of the storage node 44 changes from the ground level to the power source voltage depending on the state of the data held. If the storage node 44 is positioned directly under the channel portion 38, the changes in potential of the storage node 44 will affect the channel portion 38 and cause a change in its potential state and fluctuations in the threshold voltage. Therefore, it becomes difficult to maintain the optimal threshold voltage and there is a danger of a reduction of the writing voltage or a deterioration of the holding of the data.

Note that the layout pattern of the storage node 44 shown is one for the layout of storage type capacitors employed for a 4M DRAM, 16M DRAM, etc.

Further, proposal has been made of a DRAM cell structure with a storage node buried under a thin film semiconductor layer using an SOI structure.

FIG. 7 is a schematic sectional view of a DRAM cell using an SOI structure according to the related art.

In this conventional DRAM cell using an SOI structure, as shown in FIG. 7, an insulating film layer 68 is laid under the thin film semiconductor layer 58. The insulating film layer 68 had contact holes 69 formed in it near the thin film semiconductor layer 58. Under the insulating film layer 68 were formed storage nodes 60. The capacitor storage nodes 60 were connected to the thin film semiconductor layer 60 through the contact holes 69. Under the storage nodes 60 was laid a cell plate layer 66 through a capacitor insulating film 64. The capacitor storage nodes 60, insulating film layer 64, and cell plate layer 66 constituted capacitors. Note that in the figure, 54a and 54b are word lines and 56 is a bit line.

In such a structure of a DRAM cell, it is possible to generate more surface area of the side walls and obtain a desired storage capacity by increasing the height (depth) of the storage nodes 60. Further, since the pattern for formation of the storage nodes 60 is a pattern which removes overlapping margin of the contact holes 69, the area of the cells can be expected to be considerably reduced.

When making such a DRAM cell of the related art, however, as shown in FIG. 8, an insulating layer 68 is laid on the semiconductor substrate 67 for formation of the semiconductor layer 58 shown in FIG. 7, contact holes 69 are formed, a polycrystalline silicon film forming the storage nodes 60 is laid, then the polycrystalline film is etched by reactive ion etching (RIE) etc. to form the node formation holes 61 and the storage nodes 60 are formed. In the related art, however, due to the overetching at the time of etching for formation of the storage nodes, the polycrystalline silicon in the contact holes 69 and the surface of the thin film semiconductor substrate 67 were even etched and there was the danger of formation of the grooves A.

To achieve a higher density, if the pattern for formation of the storage nodes 60 is made a pattern for removing the overlapping margin of the contact holes 69, during the RIE overetching for formation of the storage nodes 60, part of the polycrystalline silicon film filled in the contact holes 69 is also exposed to the etching. As a result, the polycrystalline silicon is etched even in the contact holes 69. If the amount of overetching can be controlled so that the etching stops at the inside of the contact holes 69, there would be no problem, but if it reaches the surface of the substrate 67 and forms grooves "A" there, it creates defective shapes, leak deficiencies, etc. at the time of processing the substrate in later steps. In particular, the higher the height of the storage node 60 is made to secure the capacitor capacity, the greater the etching error becomes and the more difficult control of the overetching becomes and the easier defects are to occur. For example, recently, the thickness of the polycrystalline silicon film has to be at least about 2 μm. If the etching precision in RIE etc. is 10 percent or so with respect to the thickness of the polycrystalline silicon film, when etching the polycrystalline silicon film to form a node formation hole 61, the etching error is at least ±200 nm. On the other hand, the thickness of the insulating film layer 68 is about 200 to 400 nm. In this way, the thickness of the insulating film layer 68 is not sufficiently great with respect to the etching error and there is a danger of formation of grooves A in the surface of the substrate 67.

SUMMARY OF THE INVENTION

A first object of the present invention is to provide a method of production of an SOI transistor device etc. wherein the method of bonding of the substrates can prevent the occurrence of air bubbles, gives an excellent bond, and is free from expansion or contraction of the pattern on the substrates and other problems.

A second object of the present invention is to provide a method for production of an SOI transistor etc. wherein the method of positioning in the SOI structure and the method of confirmation of the positioning enable accurate detection of the alignment signal using alignment marks and enable accurate evaluation of deviation.

A third object of the present invention is to provide a semiconductor device of an SOI structure having storage nodes which reduces the effect from the storage nodes to the channel portions, has cell transistors with stable threshold voltages, and, when used as a DRAM, has excellent data holding characteristics and data writing characteristics.

A fourth object of the present invention is to provide a semiconductor device, and a process for production of the same, which is free from formation of grooves on the semiconductor substrate due to overetching when etching to form the storage nodes in the process of producing the semiconductor device, has a small cell area, and has capacitors with a large storage capacity.

In order to achieve the first object of the present invention, there is provided a substrate bonding method for forming a SOI structure comprising the steps of bringing substrates into proximity in a state with one substrate a slight, substantially uniform clearance away from the other substrate and pressing one point of at least one substrate of the two substrates against the other substrate.

In accordance with the substrate bonding method of the present invention, it is possible to prevent the generation of air bubbles, achieve a bond in a good state, and bond the substrates free from problems such as pattern elongation or contraction.

In order to achieve the second object of the present invention, there is provided a method of positioning for photolithography using an alignment mark positions and/or vernier positions formed on a SOI substrate, which comprises the steps of removing semiconductor layer portions corresponding to the alignment mark portions and/or the vernier portions and making and confirming alignment for photolithography on the SOI substrate using the alignment mark portions and/or vernier portions.

In accordance with the method of positioning for photolithography of the present invention, it is possible to provide a positioning method and a positioning confirmation method in an SOI structure which enables accurate detection of the alignment signal using the alignment marks and enables accurate evaluation of misalignment.

In order to achieve the third object of the present invention, there is provided a new semiconductor device (ex.

DRAM) formed by using SOI structure, which comprises a new pattern of a strage node formed longitudinally along a word line.

In accordance with the new semiconductor device having the new pattern of the strage node of the present invention, the storage nodes are no longer positioned at the bottom layer side of the channel portion of the semiconductor layer. As a result, the effect of the storage nodes on the channel portion is lowered and the threshold voltage of the transistor in the cell is stabilized. When this semiconductor device is used as a DRAM, the data holding characteristics and the data writing characteristics are improved.

In order to achieve the fourth object of the present invention, there is provided a new semiconductor device (ex. DRAM) formed by using SOI structure, which comprises a unique strage node having a conductive side wall.

In accordance with the new semiconductor device comprising a unique strage node having the conductive side wall, it is possible to effectively prevent the formation of grooves by overetching to a surface of a semiconductor layer of the SOI structure.

DESCRIPTION OF THE PREFERRED EMBODIMENTS

Below, an explanation will be made of specific embodiments of the present invention with reference to the drawings. Note that the present invention is not limited to these embodiments and includes modifications within the scope of the claims.

First, an explanation will be made of a first embodiment of the present invention using FIGS. 9A to 9D. This embodiment relates to a bonding method of semiconductor wafers for formation of a clad semiconductor wafer having a pattern formation SOI structure. According to this embodiment, in the bonding of the substrates, it is possible to tremendously reduce the expansion and contraction of the substrates and the entrainment of air bubbles.

First, the substrates 71 and 74 to be bonded are subjected in advance to a hydrophilic treatment on their surfaces so that full use may be made of the hydrogen bonding force of the substrates. They are used in a state free from dust and other deposits. The hydrophilic treatment may be performed by (1) performing fluorine treatment to give clean Si surfaces to the substrates 71 and 74, then immediately (2) performing treatment by a mixed solution of ammonia and hydrogen peroxide water ((2) alone also possible). It is believed that the bonding force becomes higher by this treatment since the substrate surfaces become OH rich.

Figure 9A:
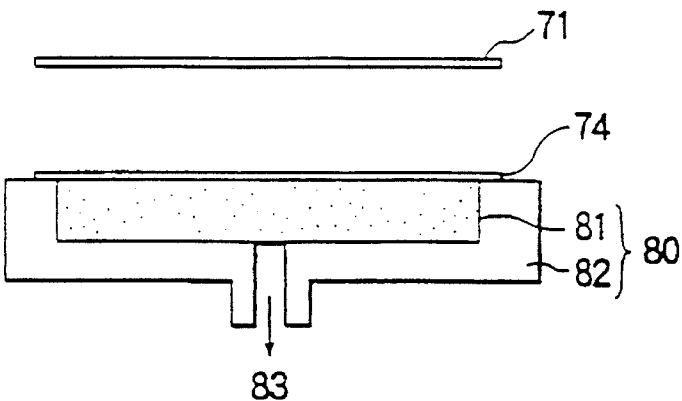

As shown in FIG. 9A, use is made of a flat vacuum chuck 80 to set the substrate 74. A vacuum is created as shown by the arrow 83. The substrate is fixed level in position by this and then the next operation is performed. Note that the vacuum chuck 80 used in this example is comprised of the air-permeable member 81 which bears the substrate 74 on its surface to support the same and a support 82 which surrounds and supports this member.

Figure 9B:
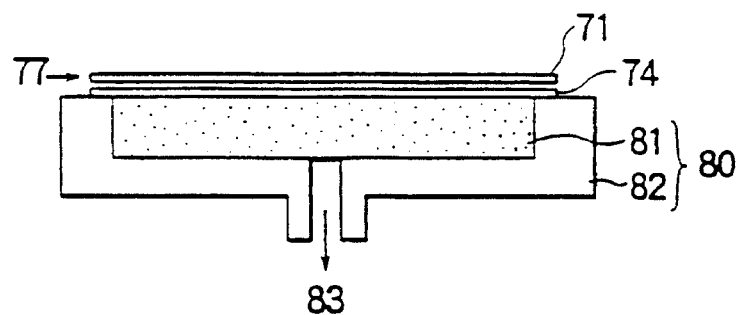

Next, as shown in FIG. 9B, the substrate 71 is brought into close, uniform proximity to the substrate 74 with a clearance of several μm. This is done by having the substrate 71 held by a vacuum chuck from above in the same way as the substrate 74, then releasing the top vacuum state at a position where the two substrates 71 and 74 are separated by at least a clearance where they do not contact each other (for example, 1 mm). As a result, the substrate 71 falls toward the substrate 74, but when the distance becomes several μm, the substrate 71 may be made to float on the substrate 74 with a slight clearance 77 due to the viscous resistance of air. This is believed to contribute to the electrostatic and other action between the substrates 71 and 74.

Figure 9C:
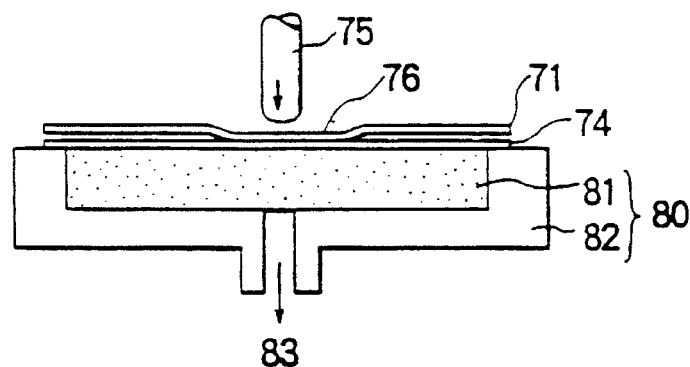

Bonding step is performed from this state as shown in FIG. 9C. That is, a push rod with a contact area of 1 to 10 mmφ (in this example, a good result can be achieved using a push rod of 5 mmφ, for example) is used as a pressing means 75 to apply a load of 0.5 to 5N (in this example, a good result can be achieved with 2N, for example) to any point of the substrate 71, such as near the center or at the periphery etc., whereupon bonding is started by the hydrogen bonding force, as shown by reference numeral 76 in FIG. 9C.

After this, the substrate 71 is allowed to stand on the flat substrate 74 in a natural state until the entire surface is adhered on its own (about 3 to 10 seconds in the case of a wafer of a diameter of 5 inches).

Figure 9D:
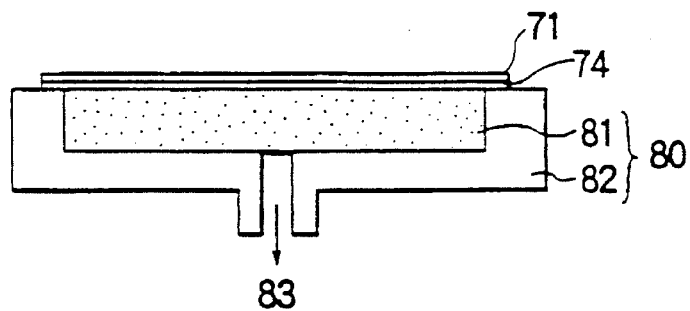

FIG. 9D shows the state after the entire surface has adhered. The vacuum flow 83 is released in this state and the bonding is thus completed.

According to this embodiment, since the adhesion occurs along the flat substrate 74, there is no expansion or contraction of the substrate. Further, since self adhesion is used, the air is naturally expelled, so it is possible to reduce the entrainment of air bubbles.

In this embodiment, the substrates 71 and 74 are kept slightly apart by bringing the substrate 74 close to the substrate 71 in the direction of gravity and making use of the elasticity of air between the substrates 71 and 74, but the invention is not limited to this. For example, it is also possible to keep them slightly apart by forcibly applying electrostatic force.

Next, an explanation will be made of a second embodiment of the present invention.

This embodiment relates to a bonding method of substrates to prepare a semiconductor element.

For example, when using a flat surface vacuum chuck for attracting one substrate as in the first embodiment, the studies of the present inventors show that when the other substrate 71 (substrate in free state) is bonded (hydrogen bonds), the bonding proceeds with a slight elongation at the portion of the reference numeral 76 shown in FIG. 9C.

As a result, when the bonding ends and the substrate is detached from the vacuum chuck, a springback force of the elongation occurs and warping occurs causing the free state side substrate to become concave. This surface clearly was bonded while elongated. Therefore, with a fine pattern, there is a danger that the pattern pitch will no longer be aligned.

In this embodiment, the bonding step is performed while compensating for amount of elongation in advance by making the fixed surface convex in shape so as to ensure the same elongation of the fixed side substrate and the free side substrate. Due to this, the elongation is eliminated in the end and bonding free of elongation is achieved.

As mentioned above, there is the following problem when setting a substrate on a vacuum chuck having a flat attachment surface, creating a vacuum, then bringing another substrate close in a free state, pressing one point by a push rod, and thus starting the hydrogen bonding. That is, since the substrates are bonded by the hydrogen bonds against the viscous resistance of air, the bonding ends up occurring while the interface is slightly elongated with a convex curvature. This can be understood from the fact that the substrate warps to a concave surface after the bonding.

Figure 10:
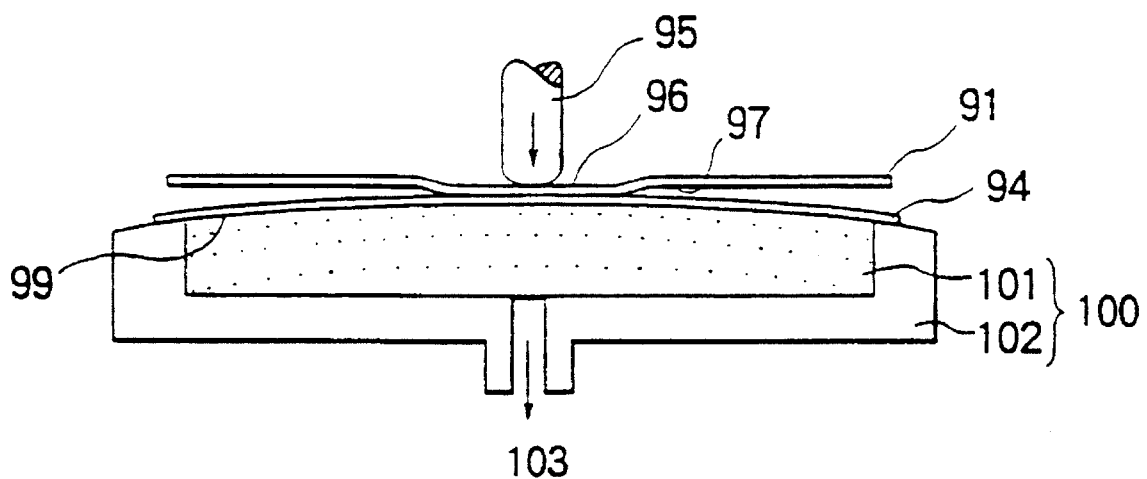
FIG. 10 shows a wafer bonding method for forming an SOI device according to a second embodiment of the present invention.

As opposed to this, in the present embodiment, the following is performed as shown in FIG. 10. The amount of elongation at the time the substrate 91 is elongated and bonded is, for example, 10 to 20 ppm or so, so as shown in FIG. 10, the fixed surface of the substrate 94 is given a convex spherical shape 99 etc. of a curvature of about the same extent as the elongation.

Figure 11:
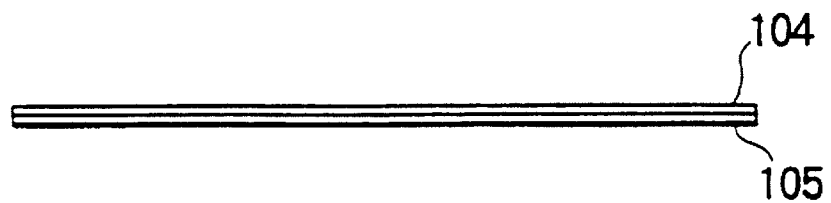
FIG. 11 shows a substrate after wafer bonding obtained by the method of FIG. 10.

The substrate 91 is bonded with the substrate 94 fixed by a fixing jig 100 which has such a convex curved surface and fixes and supports the substrate 94. Therefore, after the bonding as shown in FIG. 11, the substrates 91 and 94 are bonded by substantially the same amount of elongation, so the elongation is cancelled. Therefore, the bonding step is achieved free of deviation.

In this embodiment, a convex spherical surface was employed as this enables the elongation to be reduced the most, but another convex curved surface may be employed as well.

According to the present invention, it is possible to prevent the generation of air bubbles, achieve a bond in a good state, and bond the substrates free from problems such as pattern elongation or contraction.

Next, an explanation will be made of a third embodiment of the present invention.

This embodiment applies to the production of an SOI structure semiconductor device.

Figure 12:
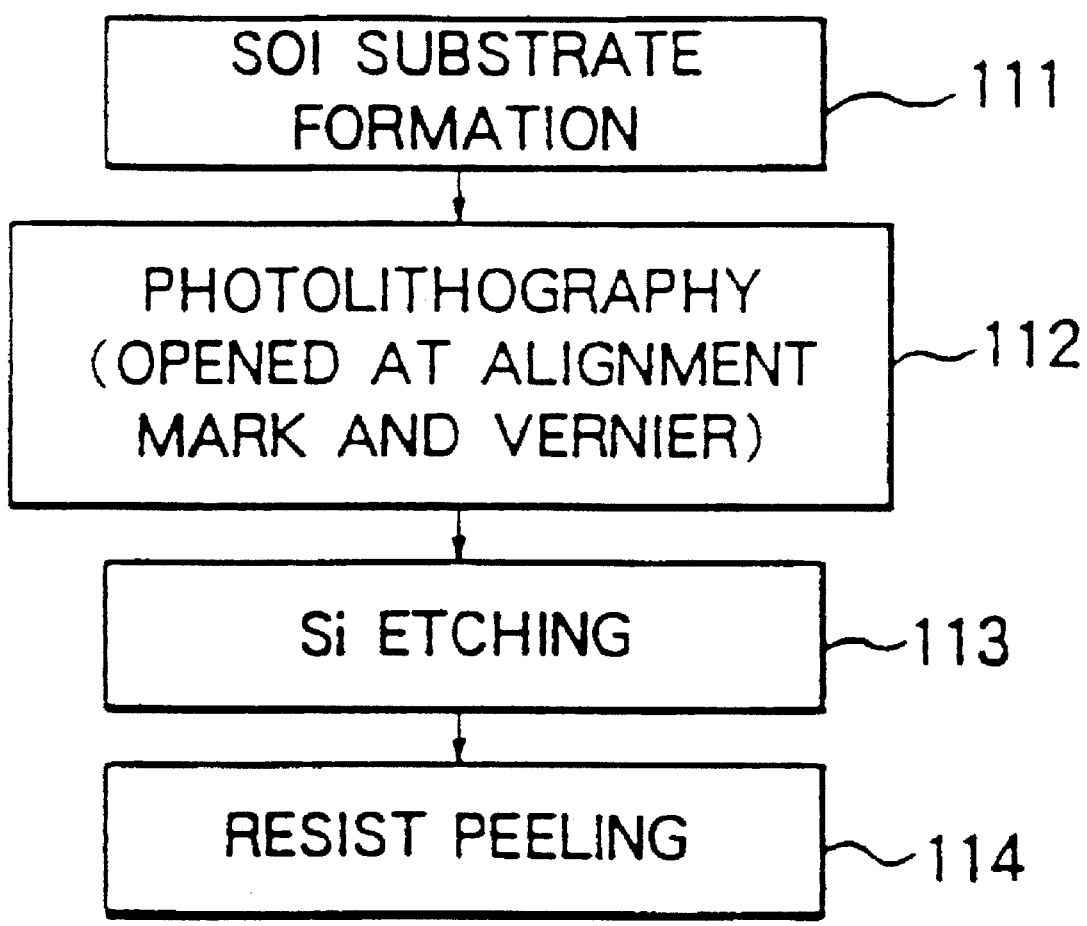
FIG. 12 shows the flow of a process for the formation of a device using an SOI substrate according to a third embodiment of the present invention.

In this embodiment, the positioning and the confirmation of positioning during the formation of the SOI structure are performed in accordance with the process sequence shown in the flow chart of FIG. 12. That is, in the embodiment, first, the SOI substrate formation step 111 is performed. Here, the previous explained bonding technology is used to obtain a substrate with an SOI structure. Next, in a photolithography step 112, alignment is performed with respect to an element isolation pattern and the resist is opened at the alignment mark portions and vernier portions. Next, an Si etching step 113 is performed to remove the semiconductor portions (Si portions) of the alignment mark portions and the vernier portions. A resist peeling step 114 is then performed and then positioning is performed using the alignment mark portions, and the positioning is confirmed using the vernier portions.

More specifically, the following processes are usually used for an SOI wafer with an element isolation pattern:

(1) Step of preparation of element isolation pattern (formation of insulation portions)

(2) Step of preparation of clad SOI wafer (bonding and polishing)

(3) Step of preparation of device

The termination of the above (2) and the input to (3) is referred to as line reinput. In the present embodiment, during this line reinput, the SOI layers of the alignment mark portions and the vernier portions of the SOI wafer with the element isolation pattern are etched and a sufficient level difference is ensured in the pattern. The SOI layer at the other portions (for example, the element formation portions) is masked by the resist and not etched. Therefore, a photolithography step aligning the lower element isolation pattern is required, but at that time it is sufficiently possible to detect the waveform of the alignment signal for the following reasons:

(1) The surface of the pattern is constituted by two substances, $SiO_2$ and Si, having different reflectances.

(2) The range of tolerance with respect to deviation in alignment is large (for example, at this time, fine alignment of 0.15 μm is not required, about 2 μm is sufficient).

Figure 13:
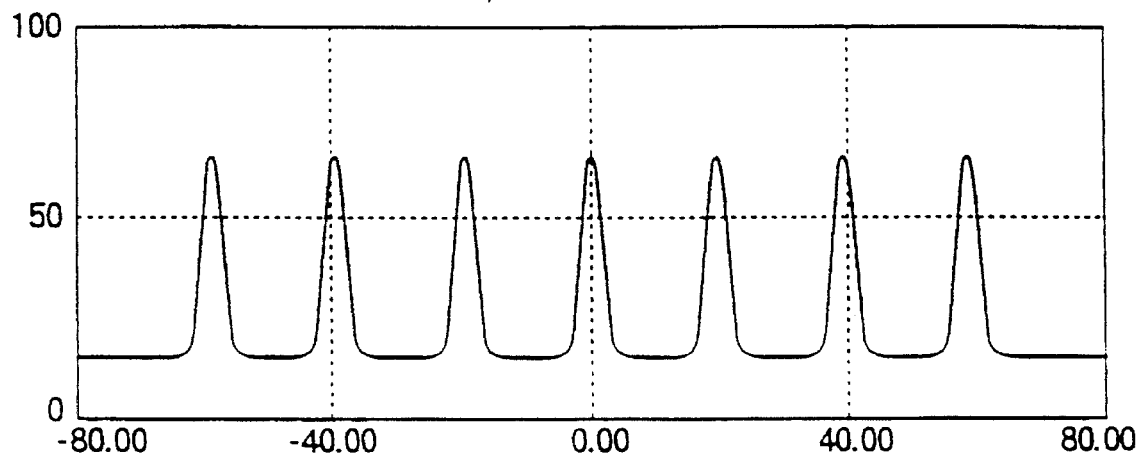
FIG. 13 is a view of the waveform of the mark signal (X direction, before resist coating) of the third embodiment.
Figure 14:
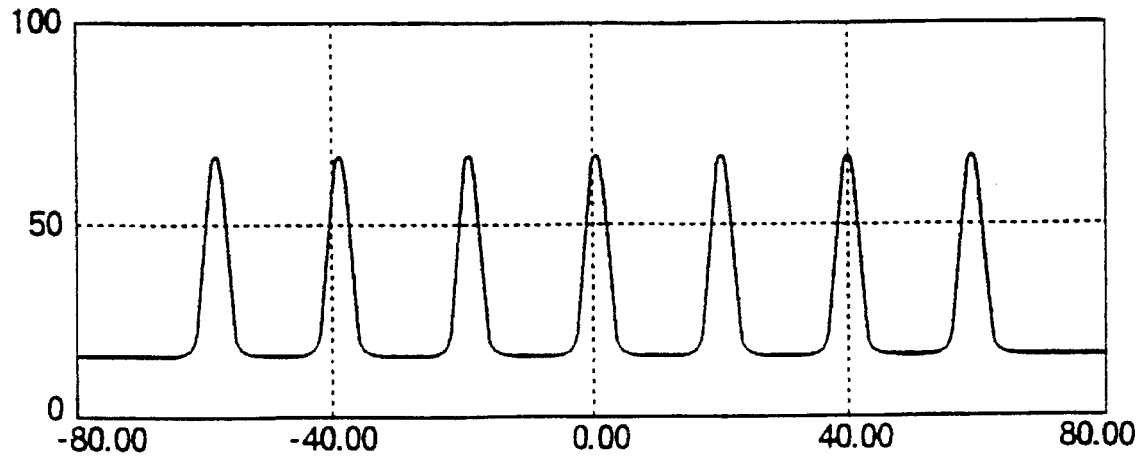
FIG. 14 is a view of the waveform of the mark signal (Y direction, before resist coating) of the third embodiment.
Figure 15:
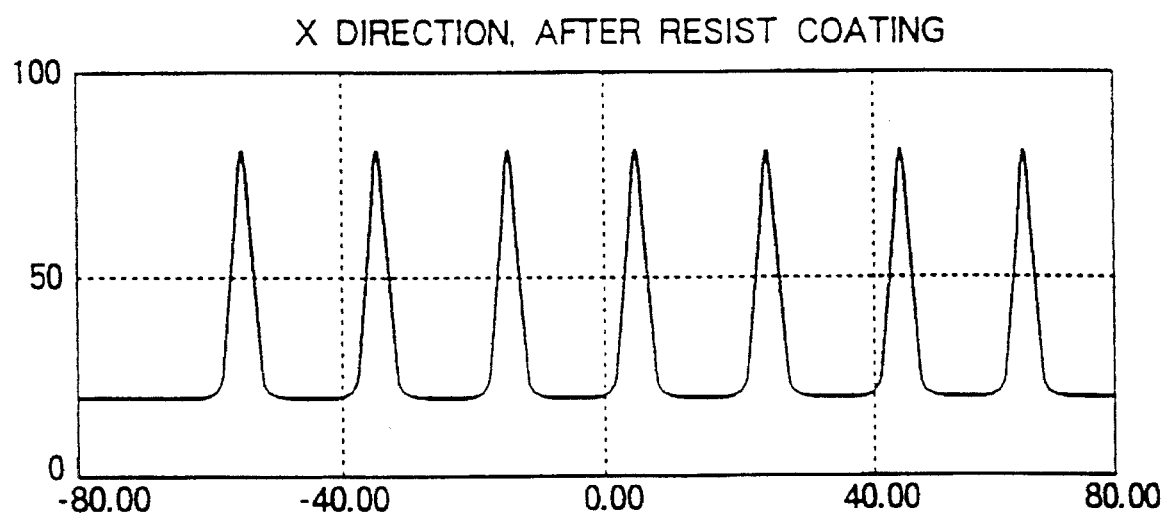
FIG. 15 is a view of the waveform of the mark signal (X direction, after resist coating) of the third embodiment.
Figure 16:
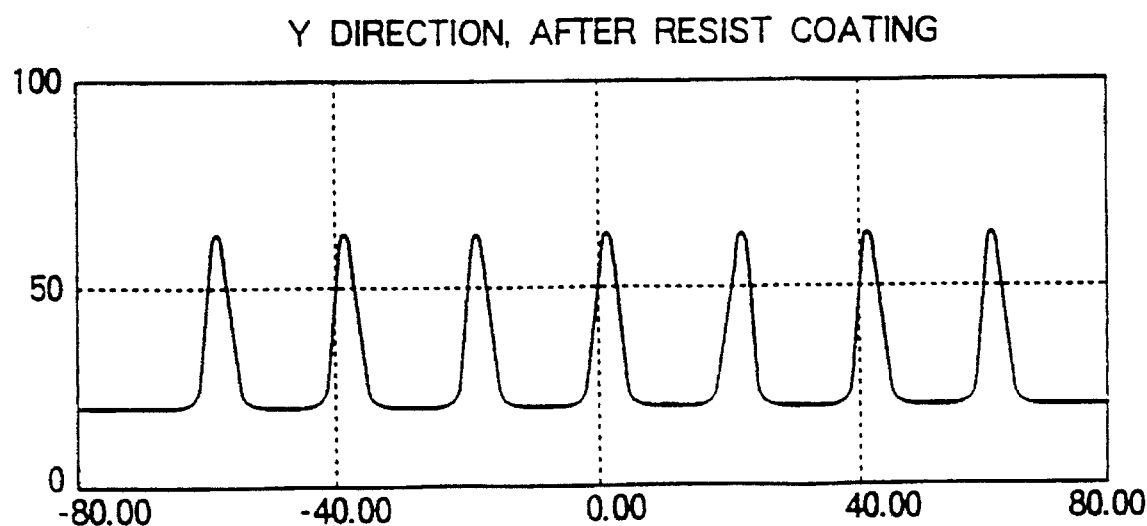
FIG. 16 is a view of the waveform of the mark signal (Y direction, after resist coating) of the third embodiment.

As a result, as shown from FIG. 13 to FIG. 16, a clear mark signal waveform is obtained. FIG. 13 shows the waveform of the detected mark signal in the X direction before resist coating, FIG. 14 shows the waveform of the detected mark signal in the Y direction before resist coating, FIG. 15 shows the waveform of the detected mark signal in the X direction after resist coating, and FIG. 16 shows the waveform of the detected mark signal in the Y direction after resist coating.

By this, in this embodiment of the present invention, a sufficient level difference of the mark portions can be secured, so a signal with a sufficient S/N ratio can be obtained.

According to the present invention, as mentioned above, it is possible to provide a positioning method and a positioning confirmation method in an SOI structure which enables accurate detection of the alignment signal using the alignment marks and enables accurate evaluation of misalignment.

Next, a fourth embodiment of the present invention will be explained with reference to the drawings.

Figure 17:
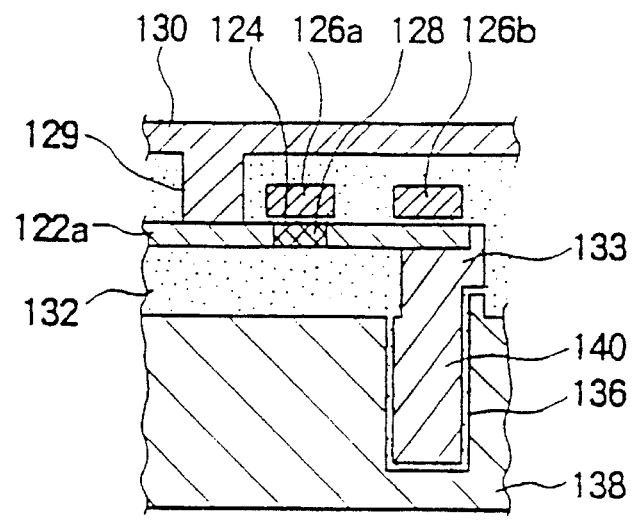
FIG. 17 and FIG. 18 are respectively a sectional view and a plane view of key portions of a DRAM according to a fourth embodiment of the present invention.
Figure 18:
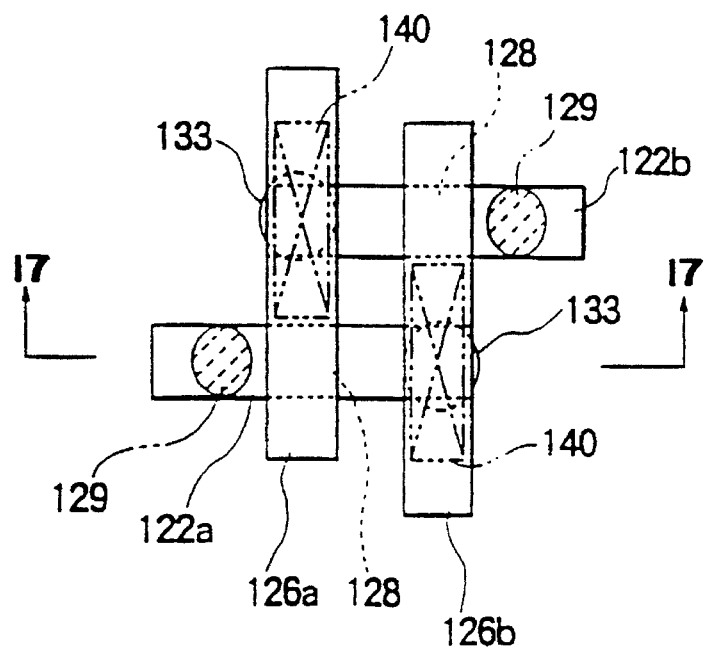

FIG. 17 and FIG. 18 are a sectional view and plane view of key portions of a DRAM according to the fourth embodiment of the present invention.

The fourth embodiment shown in FIG. 17 and FIG. 18 is an example of the application of the present invention to a DRAM. In this embodiment, the semiconductor layers 122a and 122b are formed by a predetermined pattern. On top of this are laid word lines 126a and 126b through a gate insulating layer 124. The semiconductor layers 122a and 122b are formed by the bonding SOI method and are comprised of monocrystalline silicon etc. Note that in the illustration, only two lines of semiconductor layers 122a and 122b are shown, but a large number are actually formed in accordance with the number of the memory cells.

The gate insulation layer 124 laid on the semiconductor layers 122a and 122b is for example formed by heat oxidation of a semiconductor layer or CVD and is comprised of a silicon oxide layer etc. The word lines 126a and 126b formed on the gate insulating layer 124 are for example comprised of a polycrystalline silicon film formed by the CVD method, for example. Patterning is performed in a direction substantially perpendicularly intersecting the semiconductor layers 122a and 122b positioned under the same. A channel portion 128 is formed at the semiconductor layer portion of the position cutting across the semiconductor layers 122a and 122b. That is, the word lines 126a and 126b serve also as gate electrodes. The gate electrodes constituted by the word lines 126a and 126b, the gate insulation layer 124, the channel portion 128, and the semiconductor layer 122a or 122b where the source-drain portion is formed constitute memory cell transistors.

On top of the gate electrode layers 126a and 126b are laid an interlayer insulating layer comprised of a silicon oxide layer formed by the CVD method, for example. On top of this are laid the bit lines 130. The bit lines 130 are formed by a polycrystalline silicon film formed by the CVD method, for example. The bit lines 130 are connected to the semiconductor layers 122a and 122b of the memory cells through the bit contacts 129 formed in the interlayer insulating layer.

Under the semiconductor layers 122a and 122b there is an insulating film layer 132. The insulating film layer 132 is comprised, for example, of a silicon oxide layer. Under the insulating film layer 132 is buried a capacitor storage node 140. The storage node 140 and the semiconductor layer 122a or 122b are connected through a contact 133 formed in the insulating film layer 132. Under the storage node 140 is laid a cell plate layer 138 through a capacitor insulating thin film layer 136. The storage node 140 is comprised of polycrystalline silicon, for example. The capacitor insulating thin film layer 136 is comprised, for example, of a laminate of a silicon oxide thin film and a silicon nitride thin film etc. The cell plate layer 138 is comprised, for example, of polycrystalline silicon.

In this semiconductor device, the storage node 140, the insulating thin film layer 136, and the cell plate 138 constitute a capacitor.

Figure 1A:
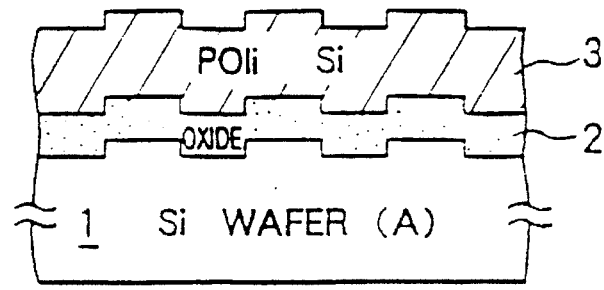
FIG. 1A to FIG. 1E show an example of the process of formation of an SOI structure according to a first related art.
Figure 1B:
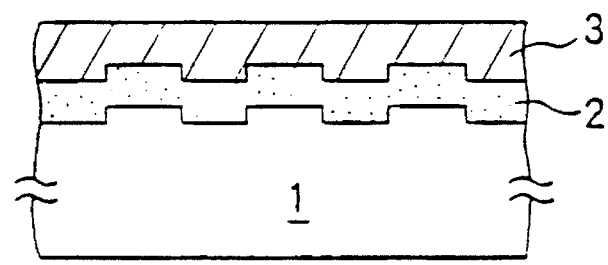
Figure 1C:
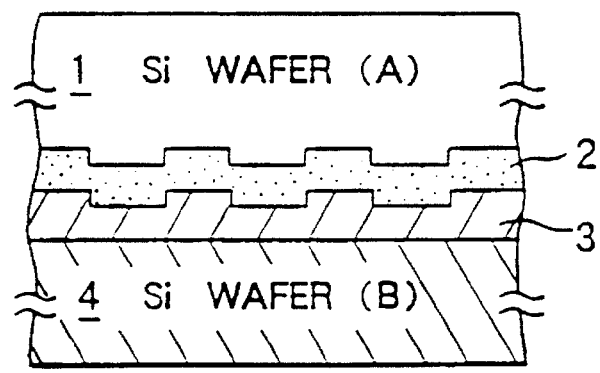
Figure 1D:
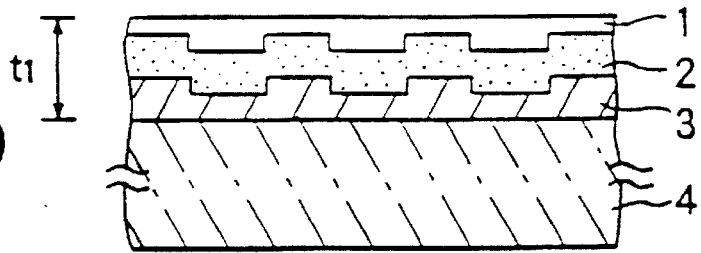
Figure 1E:
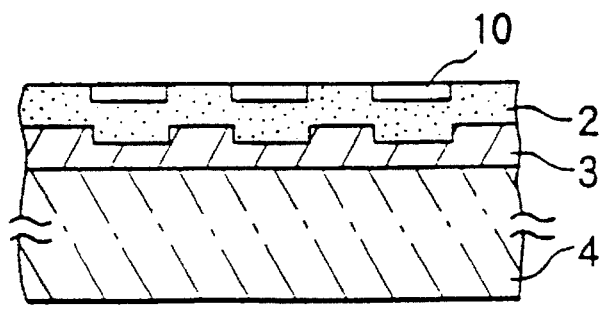
Figure 2A:
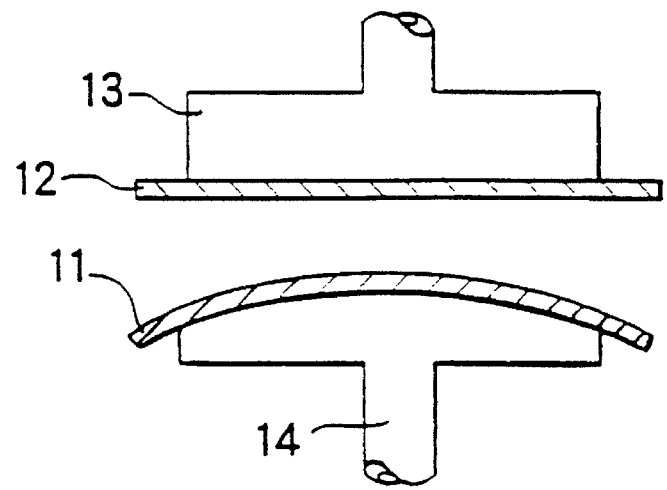
FIG. 2a to FIG. 2C show a bonding method for preparing a substrate for forming an SOI structure device according to the first related art.
Figure 2B:
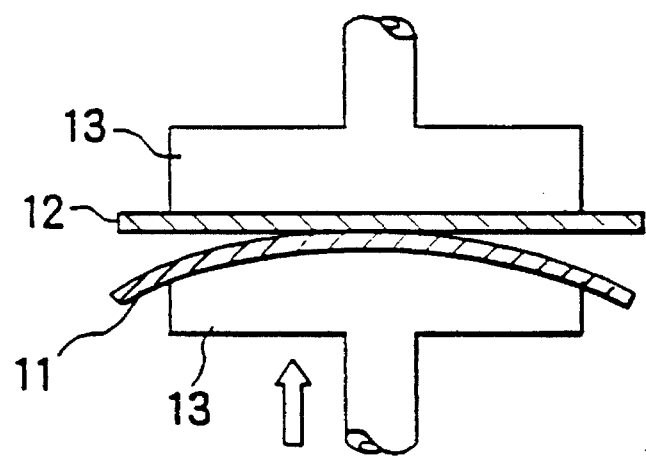
Figure 2C:
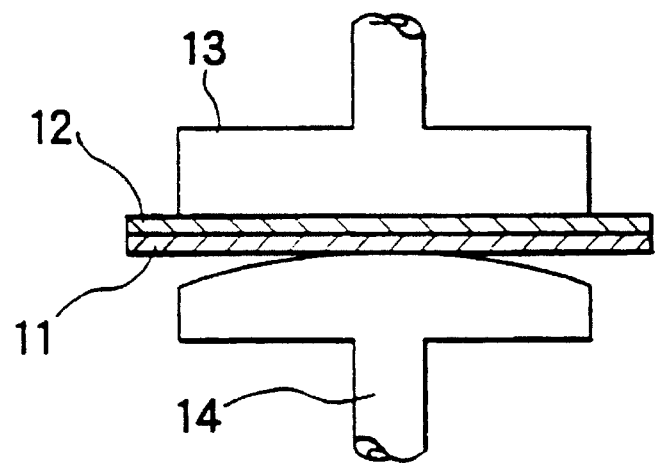
Figure 3:
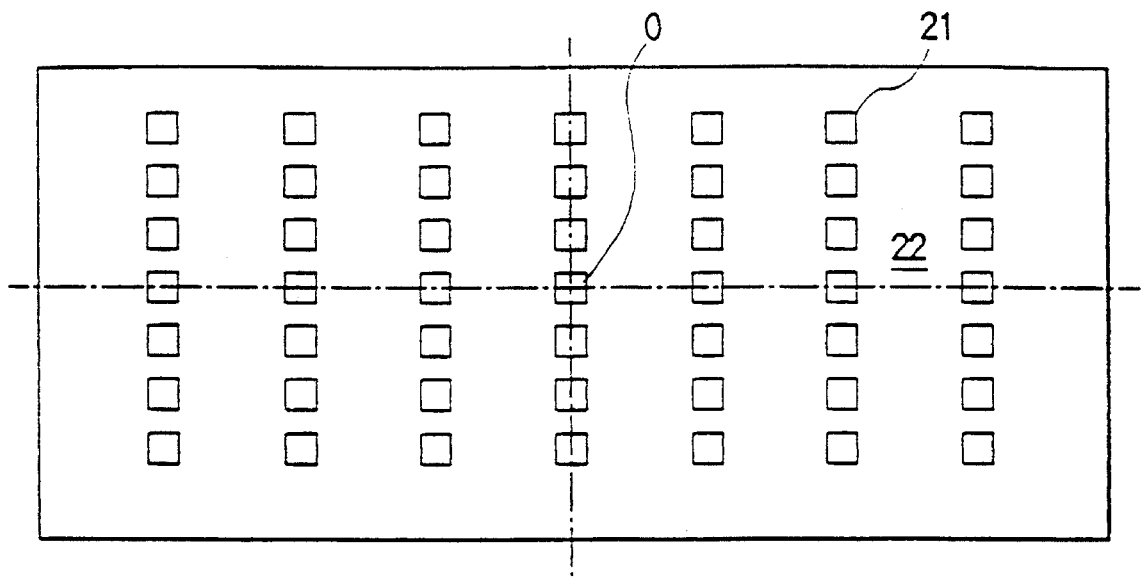
FIG. 3 shows alignment marks according to a second related art showing the background art.
Figure 4:
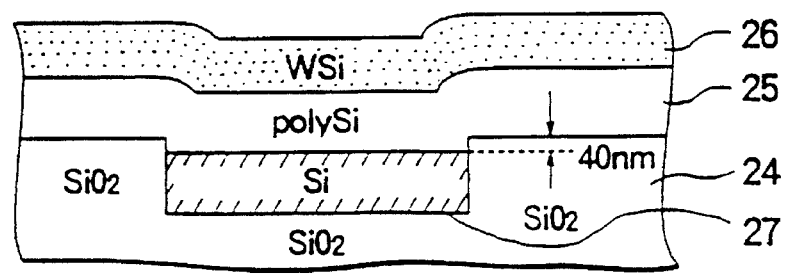
FIG. 4 is a sectional view of the alignment mark showing the second related art.
Figure 5:
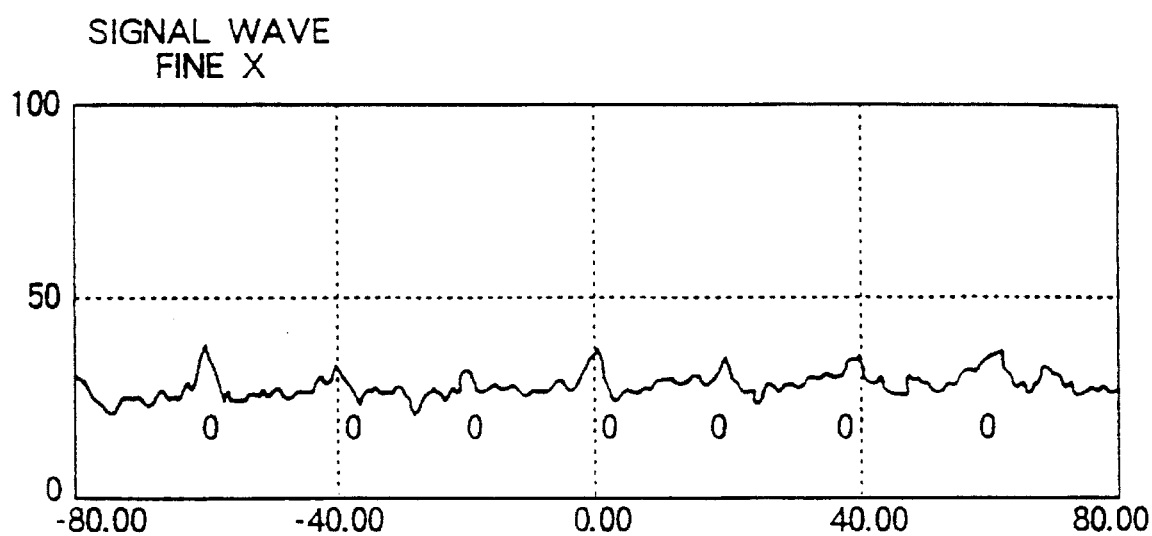
FIG. 5 is a view showing the waveform of an alignment signal according to the related art shown in FIG. 3 and FIG. 4, FIGS. 6A and 6B are respectively a sectional view and a plane view of key portions of a DRAM device of an SOI structure according to a third related art.
Figure 6A:
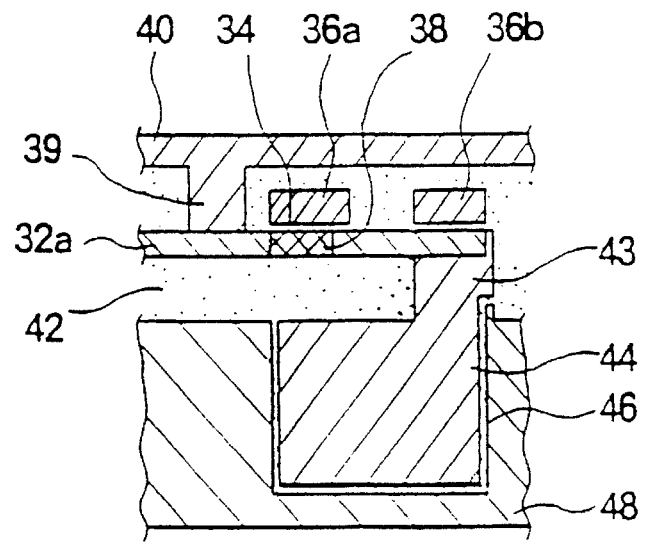

In the present embodiment, the layout pattern of the storage node 140 is made a longitudinal pattern running along the word lines 126a and 126b. Further, the sectional width of the storage node 140 is made substantially equal to the width of the word lines 126a and 126b. Further, to make the area of the plane side of the storage node as larger as possible and to increase the capacity of the capacitor, as shown in FIG. 18, the node 140 is formed narrower and longer to reach the position close to the layout pattern of the adjoining semiconductor layers 122a and 122b. As a result, the capacity of the capacitor of this embodiment never is reduced in comparison with the capacity of the capacitor of the storage node shown in FIGS. 6A and 6B.

By using the layout pattern of the storage node 140 of the present embodiment, the area directly under the channel portion 128 of the cell transistor is free of any storage node 140 with fluctuating potential, but has a cell plate layer 138 which is stable in potential, so there is no longer any fluctuation of the threshold voltage of the cell transistor due to the state of holding of data. Therefore, in the DRAM of the present embodiment, the data holding characteristics and the data writing characteristics are improved.

Figure 6B:
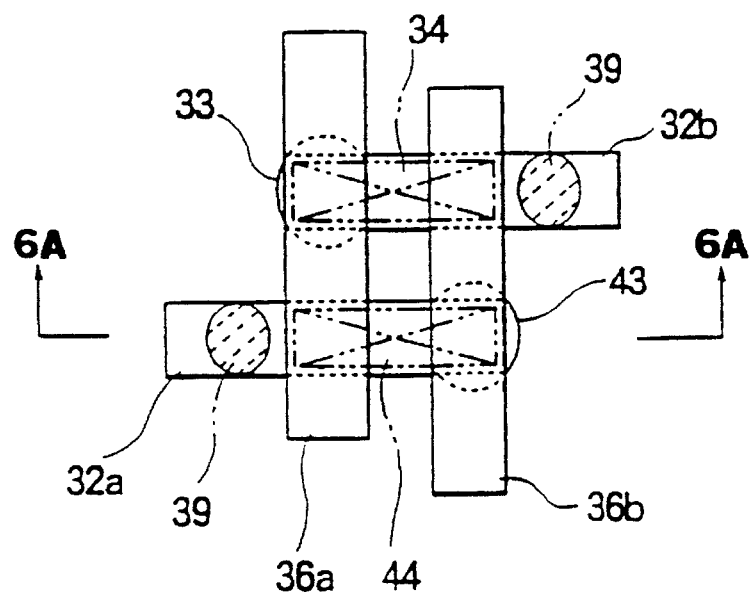
Figure 7:
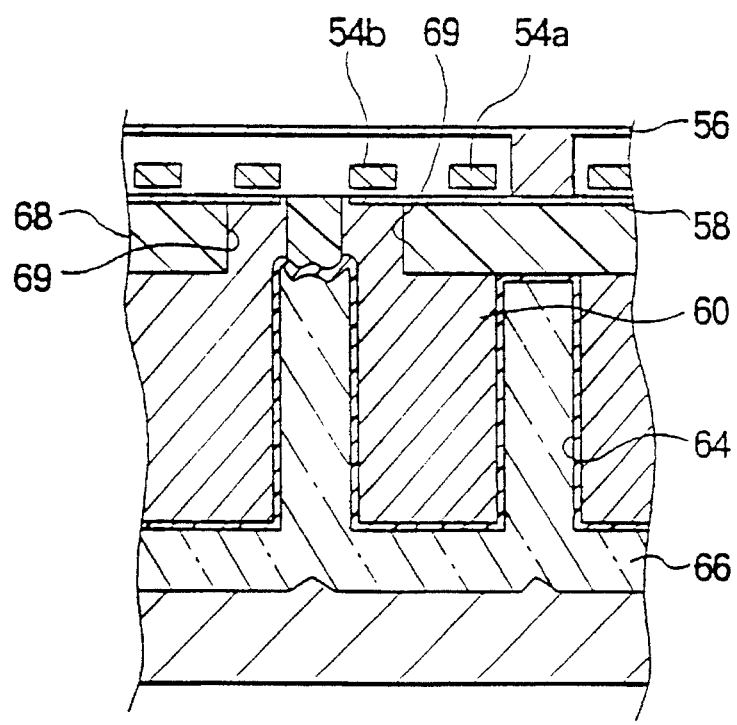
FIG. 7 is a schematic sectional view showing a DRAM according to a fourth related art.
Figure 8:
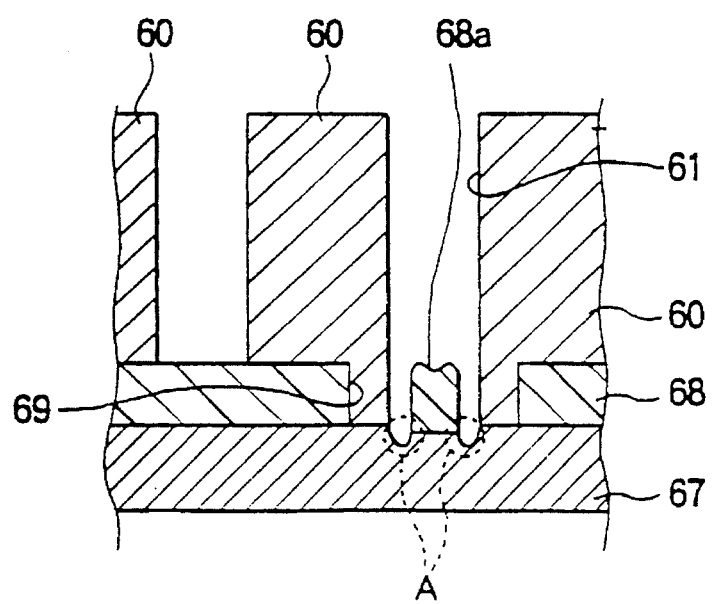
FIG. 8 is a schematic sectional view showing a process for production of the DRAM shown in FIG. 7, FIGS. 9A to 9D show a wafer bonding method for forming an SOI device according to a first embodiment of the present invention.

Further, if the layout pattern of storage node 140 according to the present embodiment is used, as shown in FIG. 18, the area of contact between the contact 133 and the storage node 140 becomes larger compared with the example shown in FIG. 6B and the contact between the semiconductor layers 122a and 122b and the storage node 140 becomes reliable.

Next, an explanation will be made of a process for production of the DRAM shown in FIGS. 17 and 18.

Figure 19:
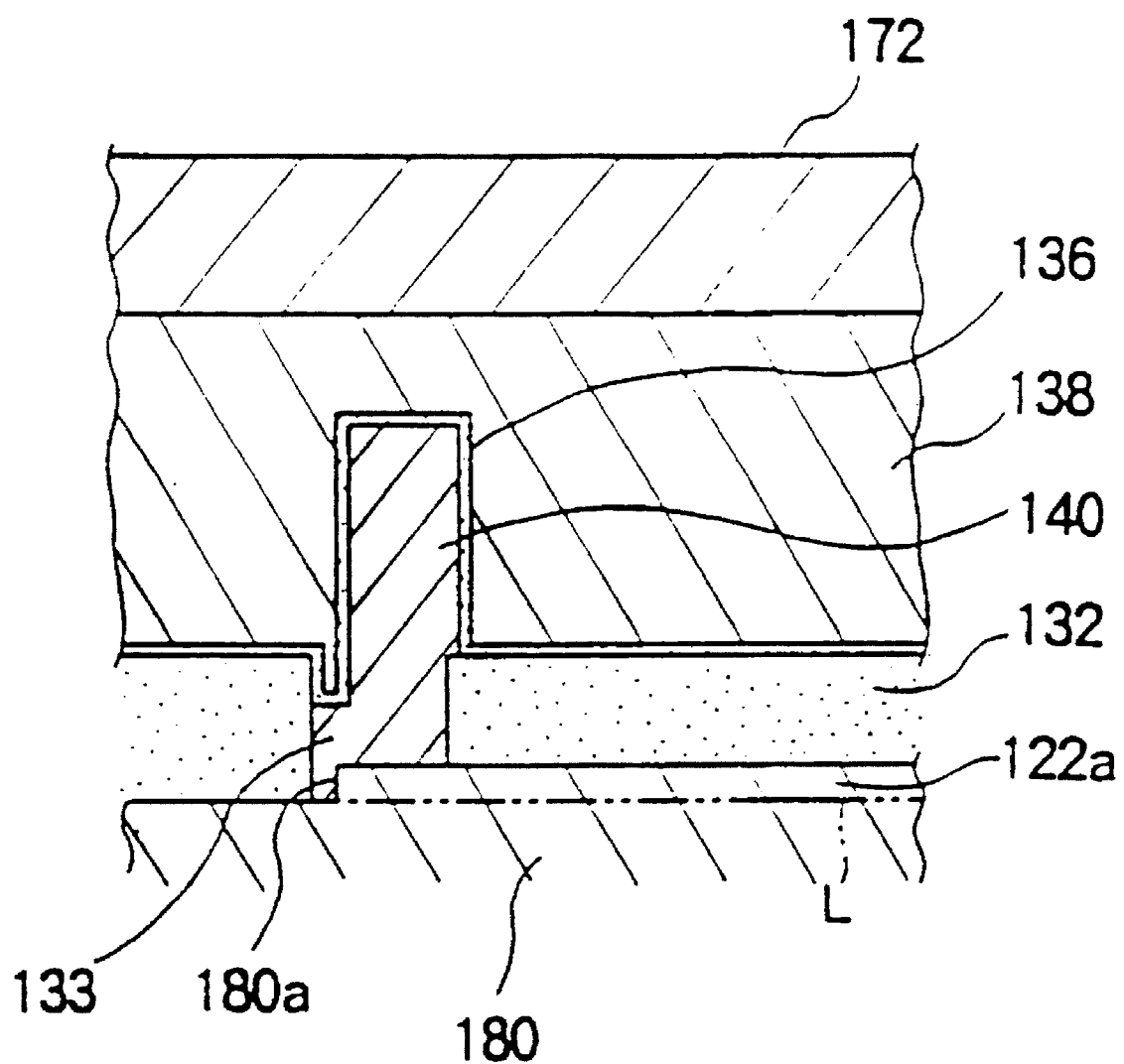
FIG. 19 is a schematic view of key portions showing the process of production of a DRAM of the fourth embodiment of the present invention.

FIG. 19 is a schematic view of key portions showing an example of the process of production of the DRAM. As shown in FIG. 19, first, an element isolation level difference 180a is formed at the surface of a silicon semiconductor substrate 180. On the surface, a silicon oxide film comprising the insulating film layer 132 is formed by CVD etc. The thickness of the silicon oxide layer is not particularly limited, but for example is about 300 nm.

After this, a contact 133 is formed by a predetermined pattern in the insulating film layer 132 and a polycrystalline silicon film forming the storage node 140 is deposited by the CVD method. The thickness of the polycrystalline silicon film forming the storage node 140 is not particularly limited, but for example is about 700 nm. after this, the polycrystalline silicon film is etched in a predetermined pattern to obtain the storage node 140

After this, a capacitor insulating thin film layer 136 comprised of a laminate of silicon oxide film and a silicon nitride film etc. is formed on the surface of the storage node 140 and the insulating film layer 132. A polycrystalline silicon film for formation of the cell plate layer 138 is formed by the CVD method etc. on the surface of the capacitor insulating thin film layer 136. The thickness of the polycrystalline silicon film is not particularly limited, but for example is about 400 nm. On top of this, a polycrystalline silicon film is further deposited to about 5 μm, the surface is polished to about 3 μm to flatten it, then the support substrate 172 is bonded by wafer bonding method or other means. The support substrate 172 is constituted, for example, by a silicon wafer.

Next, the semiconductor substrate 180 is ground from the rear surface. Finally, polishing is performed to the position L using the silicon oxide film constituting the insulating film layer 132 as a stopper surface and therefore a thin semiconductor layer 122a of about 100 nm is obtained. After this, the assembly is turned upside down so that the support substrate 172 side is at the bottom, then as shown in FIG. 17, a gate insulating layer 124, the word lines 156a and 156b, the interlayer insulating layer, and the bit line 160 are successively formed on the surface of the semiconductor layer 122a.

Figure 20:
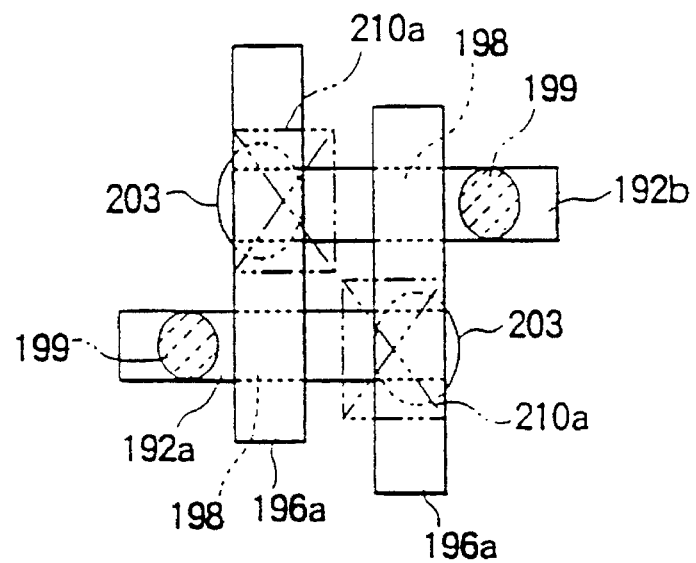
FIG. 20 is a plane view of a DRAM according to a fifth embodiment of the present invention.

FIG. 20 is a plane view of a DRAM according to a fifth embodiment. As shown in FIG. 20, the sectional width of the storage nodes 210a and 210a are greater than the width of the word lines 196a and 196b and the corner portion of one storage node 210a approaches the corner portion of the other storage node 210b.

In this embodiment, the storage node 210a can be arranged away from the channel portion 198 of the adjoining semiconductor layers 192a and 192b by a certain margin, so even if misalignment occurs, the positioning of the storage node directly under the channel 198 can be effectively prevented. Despite this, the area occupied by the storage node 210a is not reduced compared with the embodiment shown in FIG. 18 and a sufficient capacitor capacity can be realized.

Further, in this embodiment, the corner portions of the storage nodes 210a and 210a are in close proximity, but since there is an effect of the refracted light at the time of exposure, it is possible to easily separate the two by patterning and therefore the two never short circuit.

Figure 21:
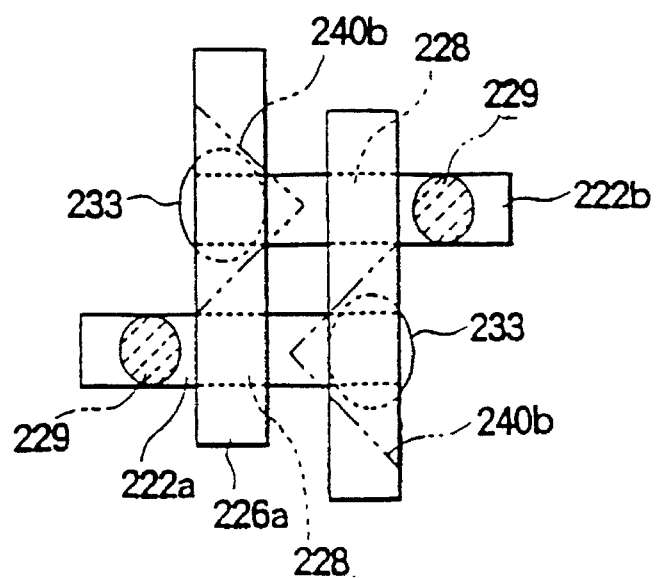
FIG. 21 is a plane view of a DRAM according to a sixth embodiment of the present invention.

The longitudinal sectional shape of the storage nodes in the direction of the word lines 196a and 196b is not necessarily limited to a rectangular shape, FIG. 21 is a plane view of a DRAM according to a sixth embodiment. As shown here, the shape may be a triangular shape having a bottom side running along the direction of the word lines 226a and 226b. In this embodiment too, a similar action as in the above embodiment is obtained.

The semiconductor device of the present invention need not be used for only a DRAM, but can be used for another semiconductor device having an SOI structure with storage nodes As explained above, according to the present invention, in a semiconductor device of an SOI structure having storage nodes, the storage nodes are formed at the top layer side of the semiconductor layer in a longitudinal fashion along the word lines formed so as to substantially perpendicularly intersect the semiconductor layer, so the storage nodes are no longer positioned at the bottom layer side of the channel portion of the semiconductor layer. As a result, the effect of the storage nodes on the channel portion is lowered and the threshold voltage of the transistor in the cell is stabilized. When this semiconductor device is used as a DRAM, the data holding characteristics and the data writing characteristics are improved.

Next, an explanation will be made of an eighth embodiment of the present invention.

Figure 22:
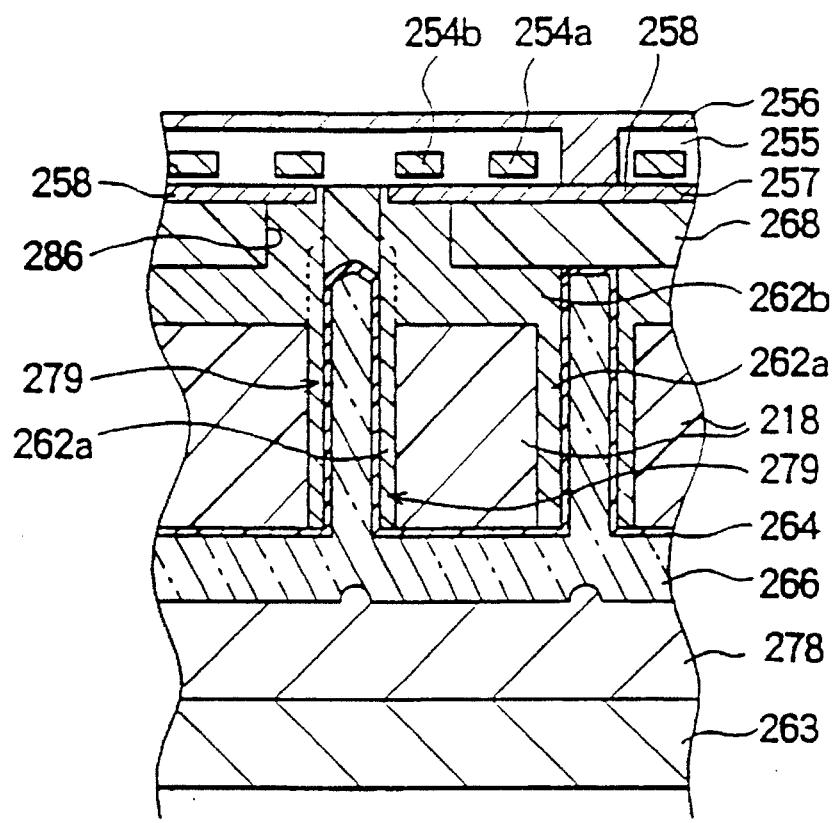
FIG. 22 is a schematic sectional view of a DRAM using an SOI structure according to a seventh embodiment of the present invention.

FIG. 22 is a schematic sectional view of a DRAM according to the seventh embodiment of the present invention.

In this embodiment, the thin film semiconductor layer 258 is formed by a predetermined pattern. Word lines 254a and 254b are laid on top of it over a gate insulating layer 257. The thin film semiconductor layer 258 is formed by the bonding SOI method and is comprised of monocrystalline silicon etc. Note that in the figure, only the thin film semiconductor layer 258 formed with the channel portion of the word line 254a is illustrated, but in actuality a large number are formed in a predetermined pattern in the two dimensional directions in accordance with the number of the memory cells.

The gate insulating layer 257 formed on the thin film semiconductor layer 258 is comprised for example of a silicon oxide layer etc. The word lines 254a and 254b formed on the gate insulating layer 257 are comprised by a polycrystalline silicon film formed by the CVD method. The word lines 254a and 254b serve also as the gate electrodes of a transistor and have a source region and drain region formed at the two sides. The word lines 254a and 254b are patterned in the direction substantially perpendicularly intersecting the thin film semiconductor layer 258 positioned at the lower layer. A channel portion is formed at the portion of the semiconductor substrate positioned cutting across the thin film semiconductor layer 258.

On the word lines 254a and 254b are laid an interlayer insulating layer 255 comprised by a silicon oxide layer formed by the CVD method. On top of this are formed a bit line 256. The bit line 256 passes through the bit contact hole formed in the interlayer insulating layer 255 to connect with the thin film semiconductor layer 258 of the memory cells. The thickness of the interlayer insulating layer 255 is not particularly limited, but for example is 300 nm.

Underneath the thin film semiconductor layer 258 is laid an insulating film layer 268. The insulating film layer 268 has formed in it a contact hole 286 near the thin film semiconductor layer 258. Under the insulating film layer 268 is formed a storage node 279 by a predetermined pattern. In this embodiment, the storage node 279 is comprised of a conductive layer 262b comprised by a polycrystalline silicon film etc. and a side wall 262a comprised by a polycrystalline silicon film formed at the side portion of a dummy layer 218. The dummy layer 218 is comprised for example of a silicon oxide layer, the thickness of which is not particularly limited, but for example is about 1.2 μm. At the outer periphery of the side wall 262a constituting the storage node 279 is laid a cell plate layer 266 through a capacitor insulating thin film layer 264. The capacitor insulating thin film layer 264 is comprised for example of a silicon oxide thin film and a silicon nitride thin film etc. The cell plate layer 266 is for example comprised of polycrystalline silicon, the thickness of which is for example about 50 nm. Under the cell plate layer 266 is laid a flattening layer 278 and a support substrate 263. The flattening layer 278 is comprised of a polycrystalline silicon film, while the support substrate 263 is comprised for example of a silicon wafer etc.

In this semiconductor device, the capacitor storage node comprised by the side wall 262a and the conductive layer 262b, the insulating thin film layer 264, and the cell plate 266 constitute a capacitor.

In this embodiment, by making the thickness of the dummy layer 278 greater, it is possible to make the height of the side wall 262a greater and possible to increase the capacitor area. Therefore, the capacitor can be given a large storage capacity with a small cell area. Further, due to the reasons discussed later, during etching for forming the storage node 279, the semiconductor substrate forming the semiconductor layer 258 is never overetched.

Next, an explanation will be made of a process for producing the DRAM of the seventh embodiment of the present invention.

Figure 23A:
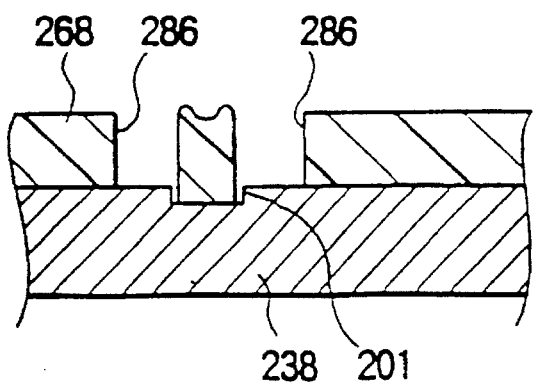
FIGS. 23A to 23F are views showing the flow of the process for forming the SOI structure DPM shown in FIG. 22.

As shown in FIG. 23A, first, an element isolation level difference 201 is formed on the surface of a silicon semiconductor substrate 238. A silicon oxide film forming the insulating film layer 268 is formed by the CVD method etc. The thickness of the silicon oxide film is not particularly limited, but is about 300 nm.

After this, a contact hole 286 to expose the surface of the semiconductor substrate 238 is formed in the insulating film layer 268.

Figure 23B:
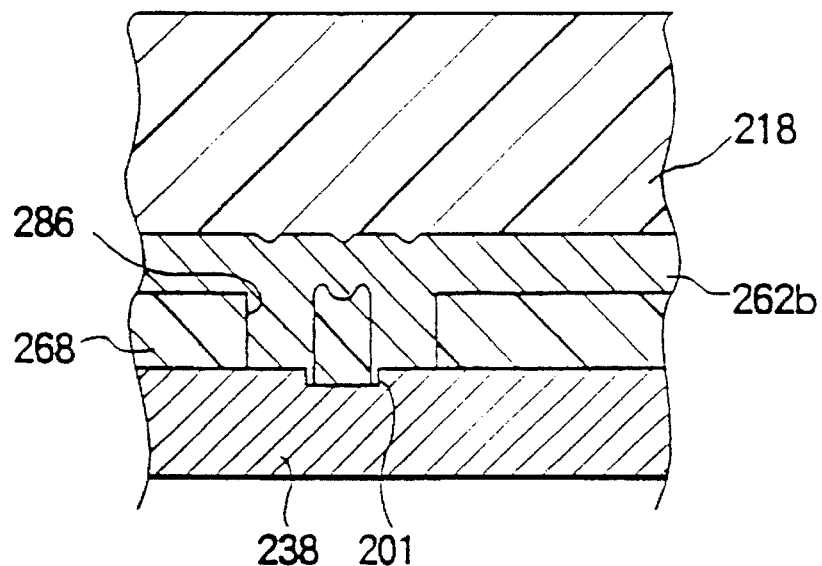

Next, as shown in FIG. 23B, a conductive layer 262b comprised of a polycrystalline silicon film for example is deposited by the CVD method etc. The thickness of the conductive layer 262b is not particularly limited, but is for example 400 nm. After this, a dummy layer 218 comprised of a different material from the above conductive layer 262b is deposited. The dummy layer 218 is for example formed by an $SiO_2$ layer etc. formed by the CVD method and is not particularly limited in thickness, but is for example 1.2 µm.

Figure 23C:
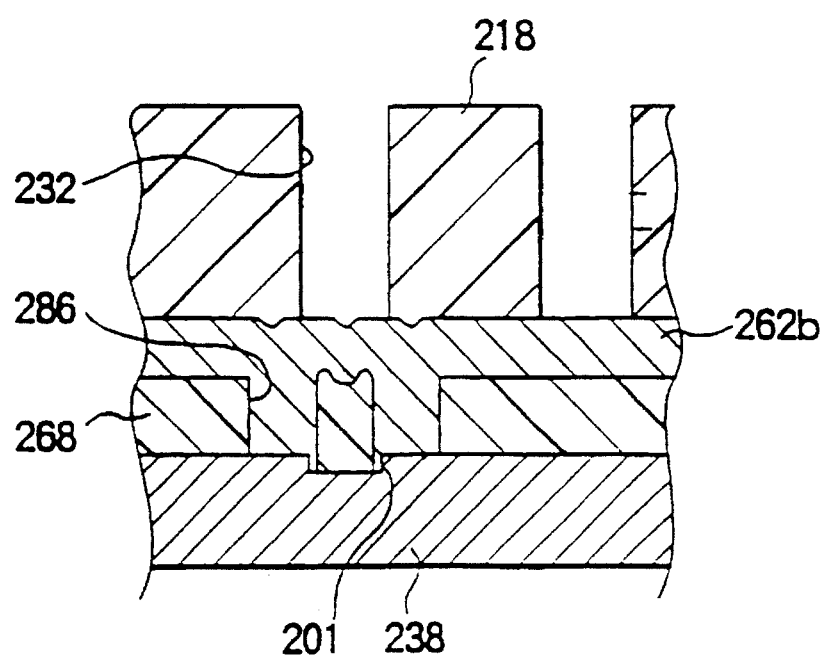

Next, as shown in FIG. 23C, the dummy layer 218 is etched by RIE using a mixed gas of $CHF_3$ and $O_2$ for example and a first node formation hole 232 is formed. The dummy layer 218 is comprised of a material different from the conductive layer 262b, so when etching the dummy layer 218 using the above mixed gas, it becomes possible to secure a high etching selectivity with the conductive layer 262b formed under the dummy layer 218. Therefore, it becomes possible to form the first node formation hole 232 in the dummy layer 218 without etching the conductive layer 262b much at all.

Figure 23D:
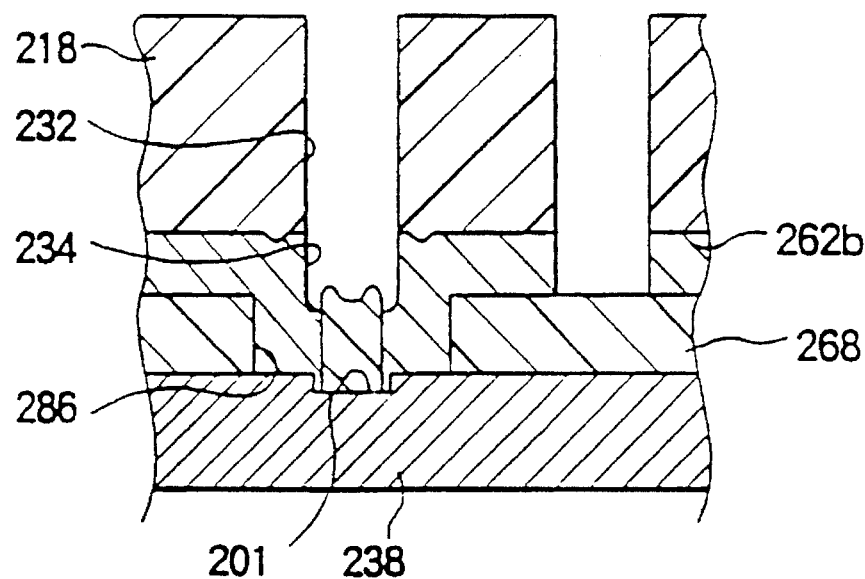

Next, as shown in FIG. 23D, the conductive layer 262b under the first node formation hole 232 is etched by RIE using chlorine type plasma etc. so as to form a second node formation hole 234. At this time the thickness of the conductive layer 262b is less than the thickness of the dummy layer 218, so the amount of overetching for forming the second node formation hole 234 need only be small and therefore the conductive layer 262b inside the contact hole 234 is not all removed and the surface of the semiconductor substrate 238 is not etched to form grooves.

Figure 23E:
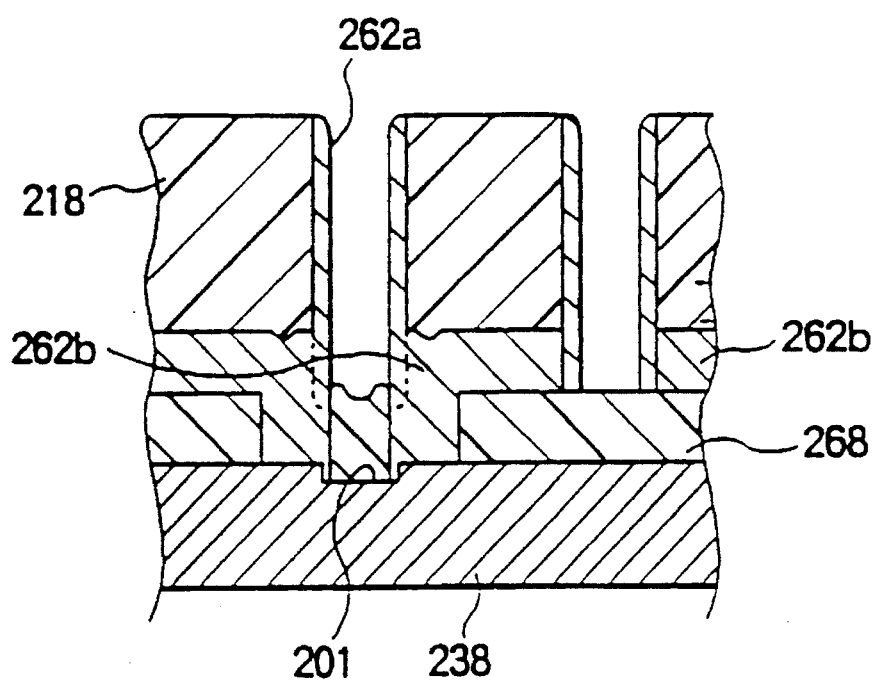

Next, as shown in FIG. 23E, a conductive layer of a polycrystalline silicon film etc. of a thickness of 60 nm, for example, is deposited by the CVD method on the surface of the dummy layer 218 and then is etched so as to form the side wall 262a at the inner periphery of the first and second node formation holes 232 and 234. The side wall 262a and the polycrystalline silicon film 262b constitute the capacitor storage node.

Figure 23F:
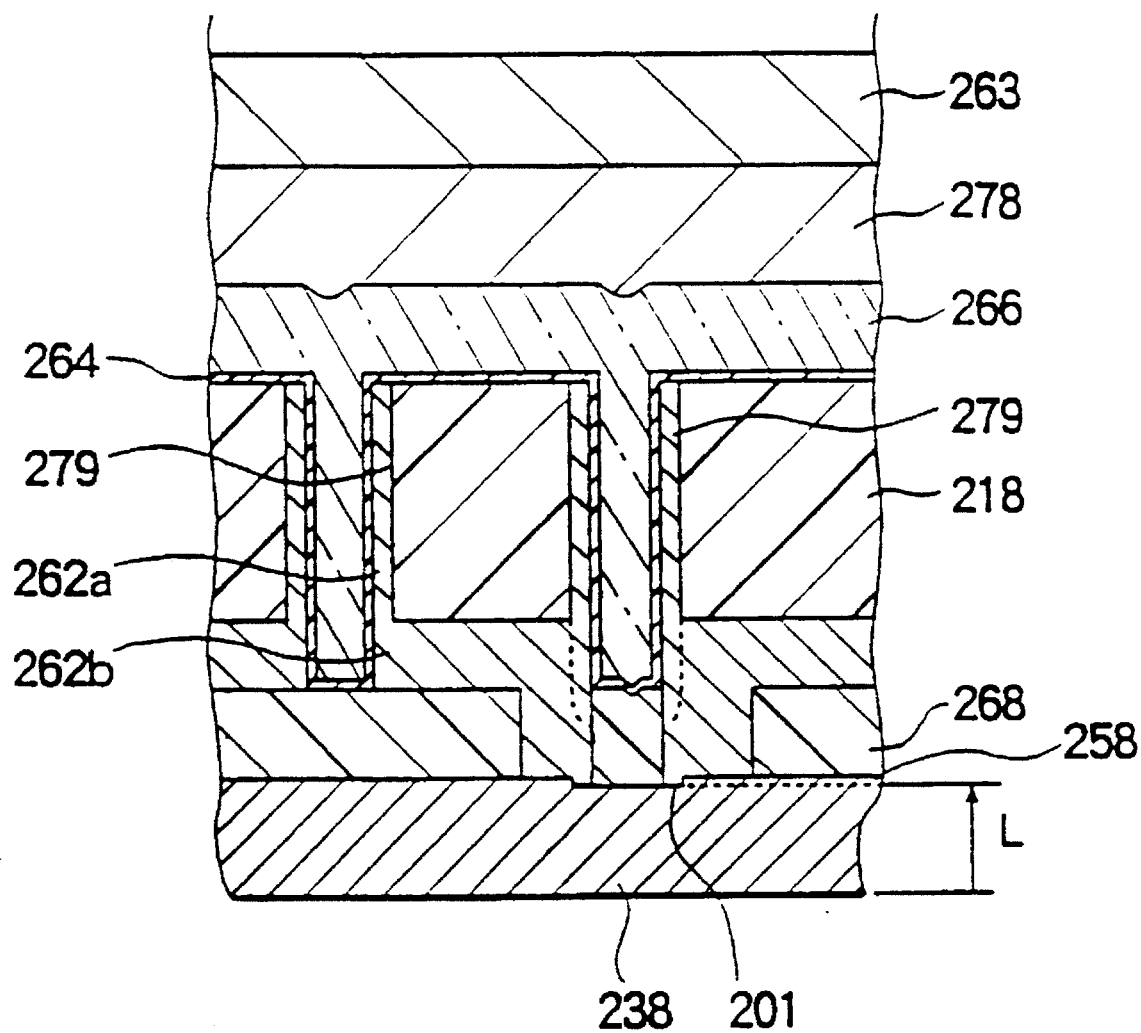

Next, as shown in FIG. 23F, a silicon nitride film of about 7 nm is formed at the outer periphery of the side wall 262a forming the storage node 279, the surface of this is oxidized to about 2 nm, and thus a capacitor insulating thin film layer 264 is formed.

After this, a polycrystalline silicon film forming the cell plate layer 266 is formed on the surface of this capacitor insulating thin film layer 264 to a thickness of about 50 nm using the CVD method etc. Further, a flattening layer 278 comprised of a polycrystalline silicon film etc. is deposited on top of this to a thickness of about 5 µm. The surface is polished about 3 µm to flatten it, then a support substrate 263 is bonded. The support substrate 263 is comprised of a silicon wafer, for example.

Next, the assembly is turned upside down so that the support substrate 263 is at the bottom and the semiconductor substrate 238 is ground from the rear surface. Finally, this is ground to the position "L" using the silicon oxide layer constituting the insulating thin film 268 as the stopper surface to thus obtain the thin film semiconductor layer 258 of for example 100 µm. After this, as shown in FIG. 22, the gate insulating film 257, word lines 254a and 254b, the interlayer insulating layer 255, and the bit line 256 are successively formed on the surface of the thin film semiconductor layer 238 to obtain a DRAM cell.

Figure 24:
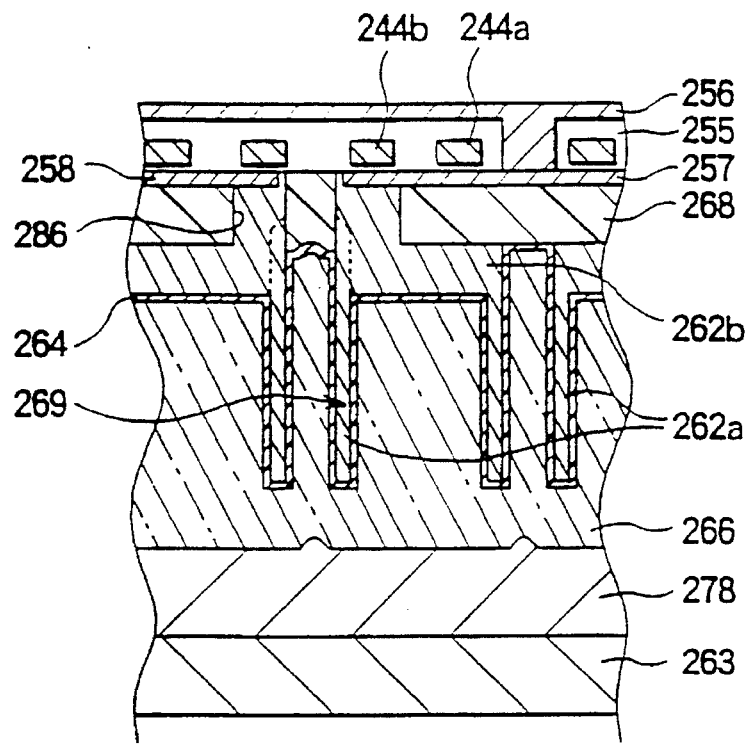
FIG. 24 is a sectional view of an SOI structure DRAM according to an eighth embodiment of the present invention.

FIG. 24 is a schematic sectional view according to an eighth embodiment of the present invention.

In the DRAM according to the eighth embodiment of the present invention, unlike with the previous seventh embodiment, the dummy layer 218 is removed after the side wall 262a is formed. Also, a capacitor insulating film layer 264 and cell plate layer 266 are formed at the outer periphery and inner periphery of the side wall 262a, so the capacitor area of a strage node 269 of this embodiment becomes about twice that of the seventh embodiment. Note that the same numerals in the eighth embodiment as the numerals in the seventh embodiment designate the same components.

Next, an explanation will be made of the process of production for the DRAM cell of the eighth embodiment.

Figure 25A:
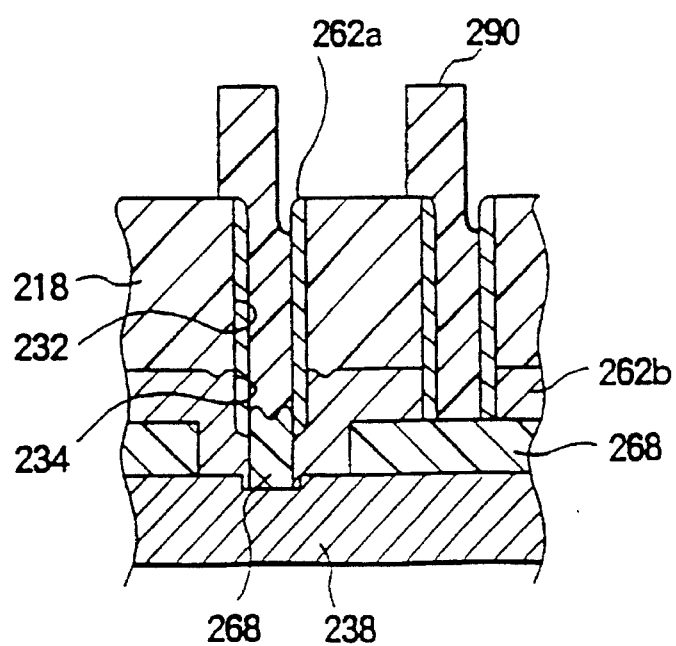
FIGS. 25A to 25C are views showing the flow of the process for forming the SOI structure DRAM shown in FIG. 24.

After the same steps as the process for producing a semiconductor device according to the above seventh embodiment, as shown in FIG. 23E, the side wall 262a is formed, then as shown in FIG. 25A, patterning is performed based on the inverted data of the storage node to form a predetermined shape of a resist mask 290 in the first node formation hole 232 and the second node formation hole 234.

Figure 25B:
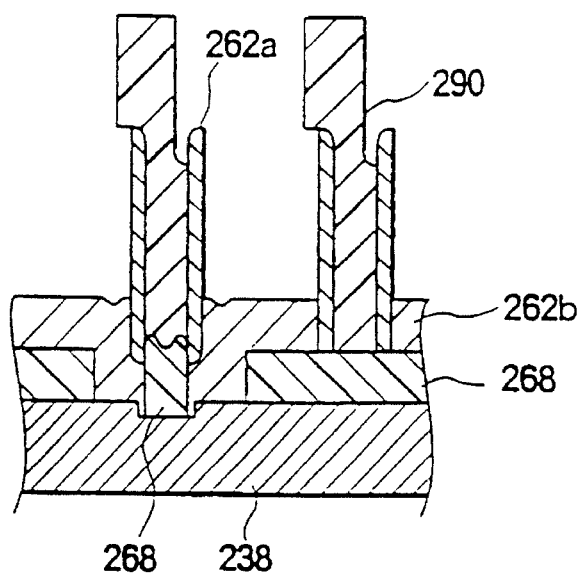

Next, as shown in FIG. 25B, fluorine treatment etc. is used to etch the dummy layer 218 and remove it. Due to this, a side wall 262a of a polycrystalline silicon film is left at the inner periphery of the first node formation hole 232.

When forming the resist 290, as shown in FIG. 25B, due to the exposure error, the resist 290 sometimes is formed covering the dummy layer 218, but since etching is performed using fluorine treatment etc., the dummy layer 218 is completely etched and removed.

Next, the resist 190 shown in FIG. 25B is etched to remove the same.

Figure 25C:
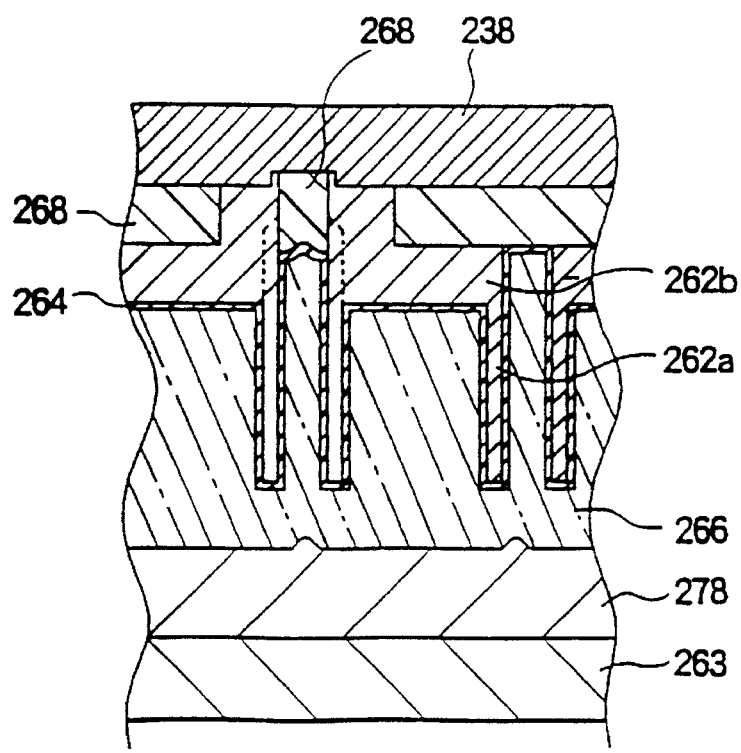

After this, as shown in FIG. 25C (turned upside down from FIG. 25B), the polycrystalline silicon film forming the capacitor insulating thin film layer 204 and cell plate layer 266 are successively laid. On top of this, further, a flattening layer 278 comprised of a polycrystalline silicon film etc. is deposited to a thickness of about 5 µm. The surface is polished to about 3 µm to flatten it, then the support substrate 263 is bonded. The support substrate 263 is comprised for example of a silicon wafer.

Next, the rear surface of the semiconductor substrate 238 is ground to obtain a thin film semiconductor layer in the same way as the seventh embodiment. After this, a gate insulating film, word lines, an interlayer insulating layer, and a bit line are successively formed on the surface of the thin film semiconductor layer to obtain the DRAM cell shown in FIG. 24.

According the present invention, a conductive side wall is formed at the side wall of the dummy layer and this side wall is used as part of the storage node. Further, when etching to form the storage node, first a first node formation hole is formed in the dummy layer and a second node formation hole is formed in the conductive layer below it. That is, the node formation holes are etched in two stages, whereby the thickness of the conductive layer may be made smaller and the error at the time of etching of the conductive layer may be made relatively small. As a result, it is possible to effectively prevent the formation of grooves by overetching to the surface of the semiconductor substrate.

Further, in particular, according to the present invention, in which the dummy layer remaining at the inside of the conductive side wall is removed and a capacitor insulating layer and cell plate layer are formed at the outer and inner peripheries of the side wall, the capacitor capacity can be further increased.

What is claim is:

1. A method of producing a semiconductor device on SOI structure comprising:

setting in a fixed position a first substrate having a first bonding surface and a second semiconductor surface which covers an isolation pattern of a plurality of semiconductor portions and insulating portions, wherein some of said semiconductor portions correspond to alignment mark portions and some corresponding to vernier portions;

positioning a second substrate to a uniform proximity over the first substrate;

releasing said second substrate so that said second substrate falls toward said bonding surface of said first substrate and floats over said bonding surface of said first substrate;

bonding said second substrate to said bonding surface of said first substrate by pressing together said first substrate and said second substrate with a push rod to form an SOI structure, wherein said bonding surface of said first substrate has a convex spherical shape with a curvature of about the same extent as an elongation of said second substrate which occurs as a result of said pressing together of said first substrate and said second substrate with said push rod, whereby said curvature substantially cancels a warping effect which otherwise occurs as a result of said elongation;

polishing said SOI structure;

subsequent to said steps of bonding and polishing, removing said semiconductor portions corresponding to alignment mark portions and vernier portions;

positioning said SOI structure utilizing said alignment mark portions based on different respective reflectances associated with said semiconductor portions corresponding to alignment portions and said insulating portions and wherein said method further includes a step of confirming the positioning said SOI structure using said vernier portions.

2. The method of claim 1 wherein said step of setting includes fixing said first substrate on a surface of a vacuum chuck.

3. The method of claim 1 wherein said bonding surface of said first substrate is pretreated with a hydrophilic treatment.

4. The method of claim 3 wherein said hydrophilic treatment includes applying a mixed solution of ammonia and hydrogen peroxide to said bonding surface.

5. The method of claim 4 wherein said hydrophilic treatment further includes cleaning said bonding surface with fluorine.

* * * * *